(12) United States Patent
Yamana et al.

(10) Patent No.: US 10,677,437 B2
(45) Date of Patent: Jun. 9, 2020

(54) WAVELENGTH CONVERSION DEVICE AND LIGHTING APPARATUS

(71) Applicant: Panasonic Intellectual Property Management Co., Ltd., Osaka (JP)

(72) Inventors: Masahito Yamana, Hyogo (JP); Noboru Iizawa, Osaka (JP); Shintaro Hayashi, Hyogo (JP); Yoshiyuki Nakano, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/322,145

(22) PCT Filed: Sep. 14, 2017

(86) PCT No.: PCT/JP2017/033194
§ 371 (c)(1),
(2) Date: Jan. 31, 2019

(87) PCT Pub. No.: WO2018/056157
PCT Pub. Date: Mar. 29, 2018

(65) Prior Publication Data
US 2019/0195484 A1 Jun. 27, 2019

(30) Foreign Application Priority Data

Sep. 21, 2016 (JP) .................................. 2016-184845
Sep. 29, 2016 (JP) .................................. 2016-192299

(51) Int. Cl.
*F21V 9/16* (2006.01)
*F21V 29/502* (2015.01)
(Continued)

(52) U.S. Cl.
CPC .............. *F21V 29/502* (2015.01); *F21V 9/30* (2018.02); *F21V 13/02* (2013.01); *G02B 5/20* (2013.01);
(Continued)

(58) Field of Classification Search
CPC ........ F21V 29/502; F21V 29/79; F21V 29/89; F21V 9/30; F21V 13/02; F21V 5/048;
(Continued)

(56) References Cited

U.S. PATENT DOCUMENTS

2006/0279950 A1* 12/2006 Hama .................. A61B 1/0653
362/257
2008/0265268 A1 10/2008 Braune et al.
(Continued)

FOREIGN PATENT DOCUMENTS

| EP | 2378838 A2 | 10/2011 |
|---|---|---|
| JP | 2003-107197 A | 4/2003 |

(Continued)

OTHER PUBLICATIONS

International Search Report (ISR) dated Nov. 21, 2017 in International (PCT) Application No. PCT/JP2017/033194, with English translation.
(Continued)

*Primary Examiner* — Ali Alavi
(74) *Attorney, Agent, or Firm* — McDermott Will & Emery LLP

(57) ABSTRACT

A wavelength conversion device, etc., for laser light according to the present disclosure includes: a first substrate that is light-transmissive; a second substrate that is light-transmissive; and a phosphor layer provided between the first substrate and the second substrate and including a phosphor that converts the wavelength of incident laser light having a predetermined wavelength. The laser light has a laser irra-
(Continued)

diation power density of at least 0.03 W/mm², and each of the first substrate and the second substrate has a thermal conductivity higher than the thermal conductivity of the phosphor layer.

12 Claims, 18 Drawing Sheets

(51) Int. Cl.
    *H01S 5/06* (2006.01)
    *H01L 33/50* (2010.01)
    *G02B 5/20* (2006.01)
    *F21V 13/02* (2006.01)
    *F21V 9/30* (2018.01)
    *F21Y 115/30* (2016.01)
    *F21V 29/89* (2015.01)
    *F21V 29/70* (2015.01)
    *F21V 5/04* (2006.01)

(52) U.S. Cl.
    CPC .......... *H01L 33/501* (2013.01); *H01S 5/0611* (2013.01); *F21V 5/048* (2013.01); *F21V 29/70* (2015.01); *F21V 29/89* (2015.01); *F21Y 2115/30* (2016.08)

(58) Field of Classification Search
    CPC ... H01L 33/501; H01S 5/0611; F21Y 2115/30
    See application file for complete search history.

(56) References Cited

U.S. PATENT DOCUMENTS

| | | |
|---|---|---|
| 2009/0147497 A1 | 6/2009 | Nada |
| 2011/0133631 A1 | 6/2011 | Berben et al. |
| 2012/0001204 A1 | 1/2012 | Jagt |
| 2012/0025218 A1 | 2/2012 | Ito et al. |
| 2013/0100635 A1* | 4/2013 | Xu .......................... F21V 9/00 362/19 |
| 2014/0003074 A1* | 1/2014 | Kishimoto ......... C09K 11/0883 362/510 |
| 2014/0084325 A1 | 3/2014 | Yamanaka et al. |

FOREIGN PATENT DOCUMENTS

| | | |
|---|---|---|
| JP | 2006-093372 A | 4/2006 |
| JP | 2006-308858 A | 11/2006 |
| JP | 2007-142318 A | 6/2007 |
| JP | 2009-506557 A | 2/2009 |
| JP | 2009-071005 A | 4/2009 |
| JP | 2009-140822 A | 6/2009 |
| JP | 2011-186350 A | 9/2011 |
| JP | 2011-228403 A | 11/2011 |
| JP | 2011-530817 A | 12/2011 |
| JP | 2012-044043 A | 3/2012 |
| JP | 2012-185403 A | 9/2012 |
| JP | 2012-521066 A | 9/2012 |
| JP | 2013-038215 A | 2/2013 |
| JP | 2013-47324 A | 3/2013 |
| JP | 2013-080833 A | 5/2013 |
| JP | 2013-197279 A | 9/2013 |
| JP | 2014-075584 A | 4/2014 |
| JP | 2014-165058 A | 9/2014 |
| WO | 2013/183556 A1 | 12/2013 |

OTHER PUBLICATIONS

Extended Search Report issued in corresponding European Patent Application No. 17852934.3, dated Jul. 18, 2019.

* cited by examiner

| LASER IRRADIATION POWER DENSITY [W/mm²] | COMPARATIVE EXAMPLE | WORKING EXAMPLE |
|---|---|---|
| 21.76 (INCIDENCE SPOT DIAMETER: ⌀0.3 mm) |  |  |
| 0.05 (INCIDENCE SPOT DIAMETER: ⌀7 mm) |  |  |

FIG. 8B

| LASER IRRADIATION POWER DENSITY [W/mm²] | COMPARATIVE EXAMPLE | WORKING EXAMPLE |
|---|---|---|
| 21.76 (INCIDENCE SPOT DIAMETER: ⌀0.3 mm) | | |
| 0.05 (INCIDENCE SPOT DIAMETER: ⌀7 mm) | | |

|  | MATERIAL NAME | REFRACTIVE INDEX | THERMAL CONDUCTIVITY [W/mK] |
|---|---|---|---|
| PHOSPHOR | YAG($Y_3Al_5O_{12}$) | 1.83 | 11.7 |
| SEALING RESIN | SILICONE | 1.58 | 0.15 |
|  | LIQUID GLASS | 1.5 | 0.3 |
| THICKNESS ADJUSTMENT PARTICLES | SILICA ($SiO_2$) | 1.46 | 1.38 |
|  | SILICONE | 1.58 | 0.15 |
|  | GLASS | 1.5 | 1 |

WAVELENGTH CONVERSION DEVICE AND LIGHTING APPARATUS

RELATED APPLICATIONS

This application is a national stage of International Application No. PCT/JP2017/033194, filed Sep. 14, 2017, which claims the benefit of Japanese Application No. 2016-184845, filed on Sep. 21, 2016, and Japanese Application No. 2016-192299, filed Sep. 29, 2016, the disclosures of which are incorporated in their entirety by reference herein.

TECHNICAL FIELD

The present invention relates to a wavelength conversion device and a lighting apparatus.

BACKGROUND ART

There are lights which use a solid-state light source. Such lights produce white light by irradiating a phosphor layer containing phosphors with light emitted by the solid-state light source, and emit the white light. For example, in the case where the light is blue light, the phosphors cause yellow light resulting from excitation by one part of the blue light and the other part of the blue light that is transmitted to disperse; thus, the lights can produce white light obtained through the color mixing of these lights by irradiating the phosphor layer with the blue light emitted by the solid-state light source.

For example, Patent Literature (PTL 1) discloses an LED which emits white light from phosphors and a layered semiconductor structure which, as a solid-state light source, emits ultraviolet light. In PTL 1, using an epoxy or silicone resin containing phosphors, a phosphor layer is formed on one principal surface of a sapphire substrate on which the layered semiconductor structure has not been formed.

CITATION LIST

Patent Literature

PTL 1: Japanese Unexamined Patent Application Publication No. 2007-142318

SUMMARY OF THE INVENTION

Technical Problem

With the structure disclosed in the aforementioned background art, however, a rise in the temperature of the phosphor layer cannot be sufficiently suppressed, and thus there is the problem that it is difficult to achieve high output by the lighting apparatus. Stated differently, the phosphor has a thermal quenching property in which wavelength conversion efficiency deteriorates with increasing temperature. With the structure disclosed in the aforementioned background art, the region of the phosphor layer which is irradiated with the light generates much heat and becomes hot. Therefore, in order to achieve high output by the lighting apparatus, it is necessary to suppress the rise in temperature of the phosphor layer.

The present invention is conceived in view of the above-described problem and has an object to provide a wavelength conversion device capable of achieving high output by suppressing the rise in temperature of a phosphor layer, and a lighting apparatus using the waveform conversion device.

Solution to Problem

In order to achieve the aforementioned object, a wavelength conversion device according to an aspect of the present invention is a wavelength conversion device for laser light which includes: a first substrate that is light-transmissive; a second substrate that is light-transmissive; and a phosphor layer that is provided between and in surface contact with the first substrate and the second substrate and converts a wavelength of laser light from laser light source which has a predetermined wavelength and is incident on the phosphor layer. The laser light has a laser irradiation power density of at least 0.03 W/mm$^2$, and each of the first substrate and the second substrate has a thermal conductivity higher than a thermal conductivity of the phosphor layer.

Furthermore, in order to achieve the aforementioned object, a lighting apparatus according to an aspect of the present invention is a lighting apparatus which uses the wavelength conversion device described above.

Advantageous Effect of Invention

The wavelength conversion device, etc., according to an aspect of the present invention is capable of achieving high output while reducing thermal load on the phosphor layer.

BRIEF DESCRIPTION OF DRAWINGS

FIG. 8B is a partial enlarged view of FIG. 8A.

DESCRIPTION OF EXEMPLARY EMBODIMENTS

Hereinafter, embodiments will be described with reference to the drawings. Each of the embodiments described herein shows a specific example of the present invention. Therefore, numerical values, shapes, materials, structural components, the arrangement and connection of the structural components, steps (processes), the sequence of the steps, etc. shown in the following embodiments are mere examples, and are not intended to limit the scope of the present invention. Among the structural components in the following embodiments, structural components not recited in the independent claims are described as structural components that can be arbitrarily added. Furthermore, the respective figures are schematic diagrams and are not necessarily precise illustrations.

Embodiment 1

[Lighting Apparatus]

Hereinafter, a lighting apparatus will be described first as an example of an application product using a wavelength conversion device in this embodiment.

Figure 1:
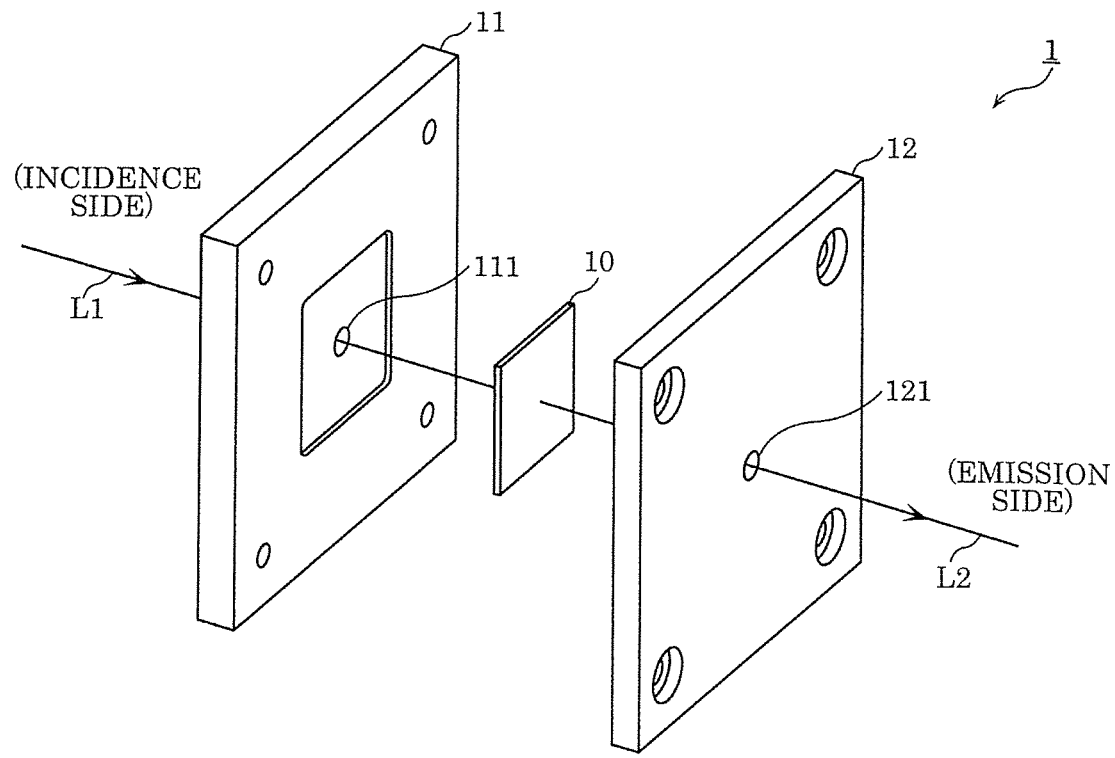
FIG. 1 is a diagram illustrating an example of a lighting apparatus in which a wavelength conversion device in Embodiment 1 is used.
Figure 2:
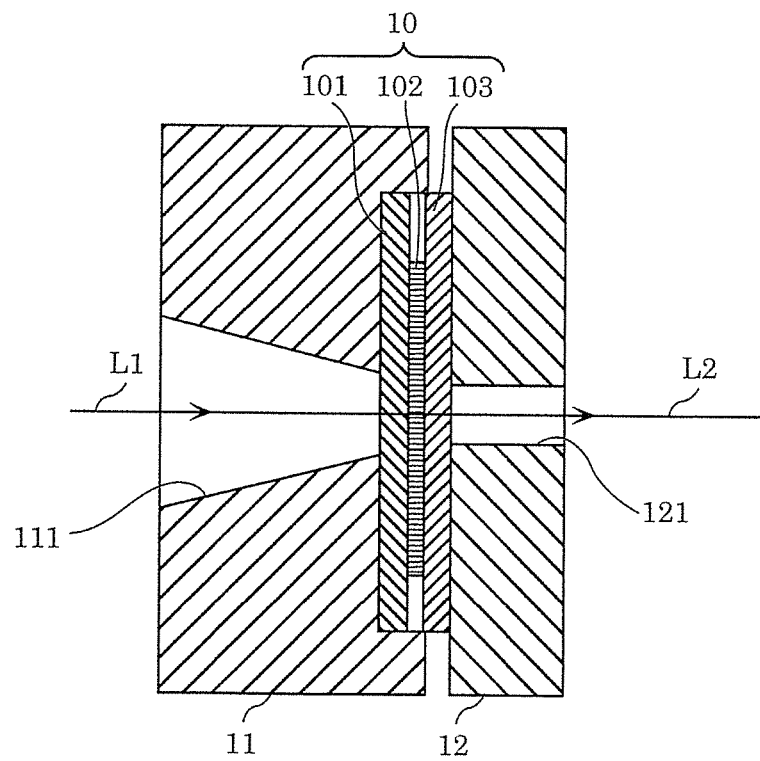
FIG. 2 is a cross-sectional view of the lighting apparatus illustrated in FIG. 1.

FIG. 1 is a diagram illustrating an example of lighting apparatus 1 in which wavelength conversion device 10 in this embodiment is used. FIG. 2 is a cross-sectional view of the lighting apparatus illustrated in FIG. 1.

Lighting apparatus 1 illustrated in FIG. 1 is used, for example, for an endoscope, a fiberscope, a spotlight, or a fishing net, produces white light from laser light having a predetermined wavelength included in a wavelength range from ultraviolet light to visible light, and emits the white light.

In this embodiment, lighting apparatus 1 includes wavelength conversion device 10, heat-dissipating plate 11, and heat-dissipating plate 12. A solid-state light source is a laser light source which emits blue laser light as laser light having a predetermined wavelength, and includes a laser diode (LD) which emits blue laser light, for example.

[Heat-Dissipating Plate 11]

Heat-dissipating plate 11 is a component that has opening 111 in a position overlapping a portion of wavelength conversion device 10 at which phosphor layer 102 is provided and dissipates, to the outside of lighting apparatus 1, heat generated at wavelength conversion device 10. Heat-dissipating plate 11 is disposed in surface contact with wavelength conversion device 10, at the end of lighting apparatus 1 (on the incidence side in the figure) on which laser light (L1 in the figure) is incident. Heat-dissipating plate 11 is formed, for example, using a material having a high thermal conductivity such as Al. Note that a surface of heat-dissipating plate 11 may be formed having ridges and grooves. This is because it is possible to improve the efficiency in dissipating heat to the outside of lighting apparatus 1 by increasing the surface area of heat-dissipating plate 11.

Opening 111 is for allowing laser light emitted from the laser light source which is a solid-state light source to pass to wavelength conversion device 10. Opening 111 is located on an optical path of the laser light emitted from the laser light source. In this way, the laser light emitted from the laser light source can reach wavelength conversion device 10 through opening 111.

[Heat-Dissipating Plate 12]

Heat-dissipating plate 12 is a component that has opening 121 in a position overlapping the portion of wavelength conversion device 10 at which phosphor layer 102 is provided and dissipates, to the outside of lighting apparatus 1, heat generated at wavelength conversion device 10. Heat-dissipating plate 12 is disposed in surface contact with wavelength conversion device 10, at the end (on the emission side in the figure) on which white light (L2 in the figure) is emitted, and heat-dissipating plate 12 is formed, for example, using a material having a high thermal conductivity such as Al. Note that a surface of heat-dissipating plate 12 may be formed having ridges and grooves. This is because it is possible to improve the efficiency in dissipating heat to the outside of lighting apparatus 1 by increasing the surface area of heat-dissipating plate 12.

Opening 121 is for allowing passage of the white light emitted from wavelength conversion device 10 so that the white light is emitted to the outside of lighting apparatus 1. Opening 121 is located on an optical path of the laser light emitted from the laser light source. In this way, the white light emitted from wavelength conversion device 10 can be emitted to the outside of lighting apparatus 1 through opening 121.

[Wavelength Conversion Device 10]

As illustrated in FIG. 2, wavelength conversion device 10, which is a wavelength conversion device for laser light, includes first substrate 101, phosphor layer 102, and second substrate 103. Note that when lighting apparatus 1 is used for an endoscope or the like, wavelength conversion device 10 corresponds to a light source means which uses laser light.

(First Substrate 101)

First substrate 101 is irradiated with laser light that has been emitted from the laser light source and passed through opening 111 of heat-dissipating plate 11. First substrate 101 includes a portion on which phosphor layer 102 is provided. The case where phosphor layer 102 is provided on first substrate 101 by being applied to first substrate 101 will be described as an example, but the method for providing phosphor layer 102 on first substrate 101 is not limited to this example.

First substrate 101 is light-transmissive. Here, first substrate 101 may be transparent with no light absorption. In other words, first substrate 101 may be formed from a material having a substantially 0 extinction coefficient. This is because the amount of laser light transmitted by first substrate 101 can increase accordingly, and, as a result, the amount of light emitted from lighting apparatus 1 to the surroundings thereof can increase.

The thermal conductivity of first substrate 101 is higher than the thermal conductivity of phosphor layer 102. Here, first substrate 101 may be a sapphire substrate, for example. Note that as the material forming first substrate 101, it is possible to use any light-transmissive material having a thermal conductivity higher than that of phosphor layer 102 such as ZnO single crystal, AlN, $Y_2O_3$, SiC, polycrystalline alumina, and GaN.

Furthermore, first substrate 101 is thermally connected to an external heat-dissipating component. In the example illustrated in FIG. 2, first substrate 101 is disposed in surface contact with heat-dissipating plate 11 as the external heat-dissipating component and is thermally connected thereto. This allows first substrate 101 to more efficiently dissipate the heat generated at phosphor layer 102 to the outside of lighting apparatus 1 via heat-dissipating plate 11.

(Second Substrate 103)

Second substrate 103 includes a portion on which phosphor layer 102 is provided and is irradiated with white light emitted from phosphor layer 102. Second substrate 103 allows the emitted white light to pass therethrough and be emitted to opening 121 of heat-dissipating plate 12.

Second substrate 103 is light-transmissive. Here, second substrate 103 may be transparent with no light absorption. In other words, second substrate 103 may be formed from a material having a substantially 0 extinction coefficient. This is because the amount of white light transmitted by second substrate 103 can increase accordingly, and, as a result, the amount of light emitted from lighting apparatus 1 to the surroundings thereof can increase.

The thermal conductivity of second substrate 103 is higher than the thermal conductivity of phosphor layer 102. Here, second substrate 103 may be a sapphire substrate, for example. Note that as the material forming second substrate 103, it is possible to use any light-transmissive material having a thermal conductivity higher than that of phosphor layer 102 such as ZnO single crystal, AlN, $Y_2O_3$, SiC, polycrystalline alumina, and GaN.

Furthermore, second substrate 103 may be thermally connected to an external heat-dissipating component. In the example illustrated in FIG. 2, second substrate 103 is disposed in surface contact with heat-dissipating plate 12 as the external heat-dissipating component and is thermally connected thereto. This allows second substrate 103 to more efficiently dissipate the heat generated at phosphor layer 102 to the outside of lighting apparatus 1 via heat-dissipating plate 12. Note that second substrate 103 does not need to be thermally connected to an external heat-dissipating component. This is because second substrate 103 even in the state of being not connected to an external heat-dissipating component or the like has the effect of dispersing the heat of phosphor layer 102.

(Phosphor Layer 102)

Phosphor layer 102 is provided between and in surface contact with first substrate 101 and second substrate 103. Phosphor layer 102 converts the wavelength of the laser light having a predetermined wavelength emitted thereto from the laser light source. Phosphor layer 102 generates heat at the time of color conversion of light.

In this embodiment, phosphor layer 102 has a wavelength-converting function of converting the color (wavelength) of laser light. Specifically, phosphor layer 102 receives the blue laser light emitted from the laser light source, produces white light that is obtained through the color mixing of yellow light resulting from conversion of part of the received blue laser light and the remaining part of said blue laser light, and emits the white light. As illustrated in FIG. 2, phosphor layer 102 is formed in a tabular shape, for example.

Phosphor layer 102 contains a plurality of phosphors (phosphor particles) which receive the blue laser light emitted from the laser light source and emit yellow light, and is formed with a sealing resin sealing the plurality of phosphors. The phosphors (phosphor particles) are, for example, yttrium aluminum garnet (YAG) phosphor particles. The sealing resin is, for example, a resin such as silicone or liquid glass. Note that heat dissipation may be enhanced by mixing with the sealing resin a material having a high thermal conductivity, for example, an inorganic oxide such as ZnO.

Phosphor layer 102 configured as described above generates heat at the time of color conversion of light, but has a thermal quenching property in which wavelength conversion efficiency deteriorates with increasing temperature. Therefore, heat dissipation of phosphor layer 102 is very important. In this embodiment, as a result of including second substrate 103 in addition to first substrate 101, the heat generated by phosphor layer 102 can be properly dissipated to the outside of wavelength conversion device 10. In other words, with first substrate 101 and second substrate 103, wavelength conversion device 10 in this embodiment can further suppress the rise in temperature of phosphor layer 102.

Furthermore, with wavelength conversion device 10, the heat dissipation effect depends on the size of the spot diameter (also referred to as an incidence spot diameter) of the light emitted to first substrate 101; a higher heat dissipation effect is obtained with decreasing incidence spot diameter (with increasing irradiation energy). Thus, in this embodiment, when a laser light source which emits laser light having a predetermined wavelength and a laser irradiation power density of at least 0.03 W/mm² is used as the solid-state light source, the rise in temperature of phosphor layer 102 is further suppressed. Note that the laser irradiation power density of the laser light may be 0.22 W/mm² or more.

[Advantageous Effects, Etc.]

As described above, in this embodiment, the heat dissipation effect can be increased; therefore, it is possible to provide wavelength conversion device 10 for laser light which is capable of achieving high output by suppressing the rise in temperature of phosphor layer 102, and lighting apparatus 1 using waveform conversion device 10.

Figure 3:
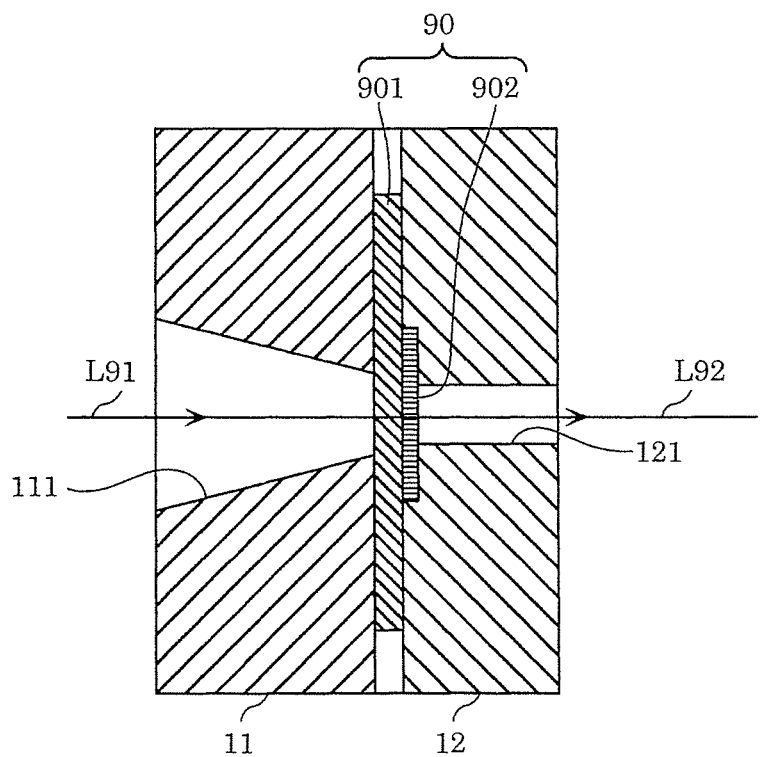
FIG. 3 is a cross-sectional view of a lighting apparatus in which a wavelength conversion device in a comparative example is used.

Here, the advantageous effects of wavelength conversion device 10 according to this embodiment will be described with reference to FIG. 3. FIG. 3 is a cross-sectional view of a lighting apparatus in which wavelength conversion device 90 in a comparative example is used. Note that the same numerical reference marks are assigned to components that are the same as or similar to those in FIG. 2, and detailed description thereof will be omitted.

In the comparative example illustrated in FIG. 3, an example of wavelength conversion device 90 including first substrate 901 and phosphor layer 902 is illustrated. Here, first substrate 901 is light-transmissive and includes a portion coated by phosphor layer 902. As a material forming first substrate 901, any material such as glass and plastic can be used, for example. Phosphor layer 902 is provided on first substrate 901. Wavelength conversion device 90 is irradiated with light (L91 in the figure) having a predetermined wavelength emitted from an LED light source. Specifically, wavelength conversion device 90 in the comparative example does not include the second substrate, but includes first substrate 901 only, and, furthermore, phosphor layer 902 is irradiated with light having a predetermined wavelength emitted from an LED light source, instead of the laser light. Note that phosphor layer 902 emits white light (L92 n the figure) resulting from color (wavelength) conversion of the light having a predetermined wavelength emitted from the LED light source.

Since wavelength conversion device 90 does not include the second substrate, phosphor layer 902 is unable to efficiently dissipate, to the outside, heat generated in a region irradiated with the light. Furthermore, in wavelength conversion device 90, first substrate 901 is irradiated with the light having a predetermined wavelength emitted from the LED light source, instead of the laser light, and thus the spot diameter (incidence spot diameter) of the light emitted to first substrate 101 is larger than that of the laser light, meaning that a high heat dissipation effect cannot be obtained. Accordingly, with the configuration of wavelength conversion device 90 in the comparative example, the rise in temperature of phosphor layer 902 cannot be suppressed, and thus there is the problem that it is not possible to achieve high output.

In contrast, in wavelength conversion device 10 in this embodiment illustrated in FIG. 2, for example, phosphor layer 102 is applied to first substrate 101 in such a manner that phosphor layer 102 is sandwiched between first substrate 101 and second substrate 103; in this way, wavelength conversion device 10 is produced. Furthermore, in wavelength conversion device 10, laser light having a predetermined wavelength and a laser irradiation power density of at least 0.03 W/mm² is used as light having a small incidence spot diameter which leads to a high heat dissipation effect.

These allow wavelength conversion device 10 in this embodiment to increase the heat dissipation effect and thus suppress the rise in temperature of phosphor layer 102. Accordingly, wavelength conversion device 10 in this embodiment can inhibit luminance saturation even when the intensity of light emitted to phosphor layer 102 increases, and thus achieves high output.

As described above, wavelength conversion device 10 according to this embodiment is a wavelength conversion device for laser light and includes: first substrate 101 which is light-transmissive; second substrate 103 which is light-transmissive; and phosphor layer 102 which is provided between and in surface contact with first substrate 101 and second substrate 103, and converts the wavelength of incident laser light having a predetermined wavelength from a laser light source. The laser light has a laser irradiation power density of at least 0.03 W/mm², and the thermal conductivity of each of first substrate 101 and second substrate 103 is higher than the thermal conductivity of phosphor layer 102.

With this, the heat dissipation effect can be increased; thus, it is possible to provide wavelength conversion device 10 for laser light which is capable of achieving high output by suppressing the rise in temperature of phosphor layer 102.

Furthermore, for example, second substrate 103 may be thermally connected to an external heat-dissipating component.

With this, the heat dissipation effect can be further increased; thus, it is possible to further suppress the rise in temperature of phosphor layer 102.

Here, each of the first substrate and the second substrate may be a sapphire substrate, for example.

With this, the heat dissipation effect can be further increased; thus, it is possible to further suppress the rise in temperature of phosphor layer 102.

Furthermore, the laser light may have a laser irradiation power density of at least 0.22 W/mm², for example.

With this, the heat dissipation effect can be further increased; thus, it is possible to further suppress the rise in temperature of phosphor layer 102.

Furthermore, for example, the laser light source may emit blue laser light as laser light having a predetermined wavelength, and phosphor layer 102 may convert the wavelength of part of the blue laser light into light in a wavelength range representing yellow light.

With this, wavelength conversion device 10 can produce white light by converting the wavelength of the blue laser light.

(Working Example)

Next, simulation evaluation results of the heat transmitting properties of wavelength conversion device 10 configured as described above will be described as a working example.

[Analytical Model]

Figure 4:
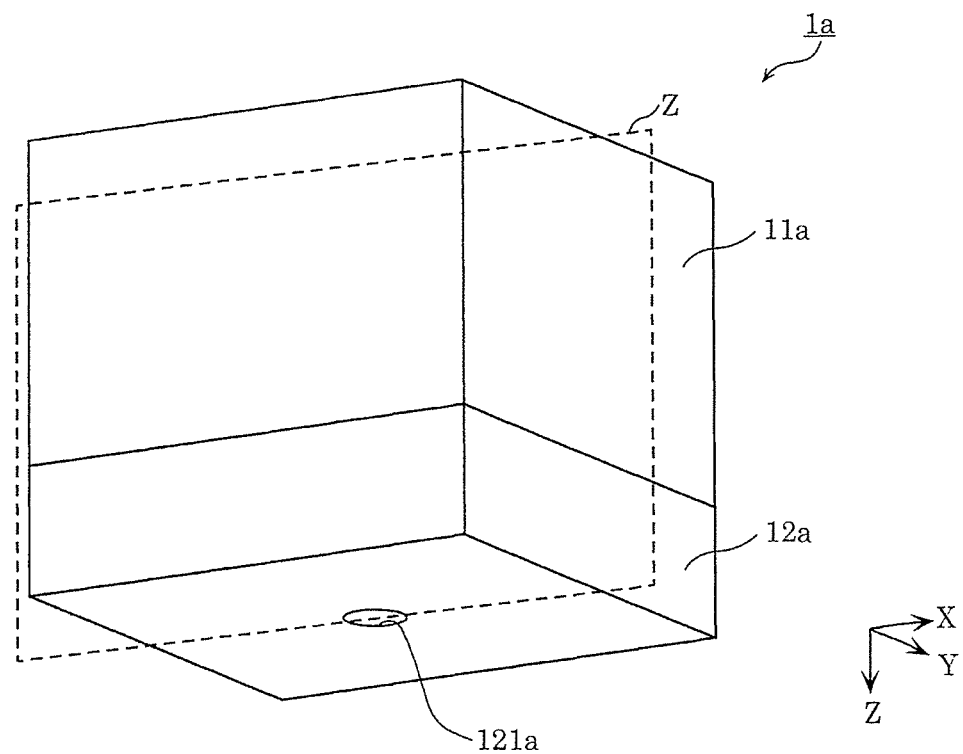
FIG. 4 is a schematic diagram illustrating an example of an analytical model of a wavelength conversion device.
Figure 5:
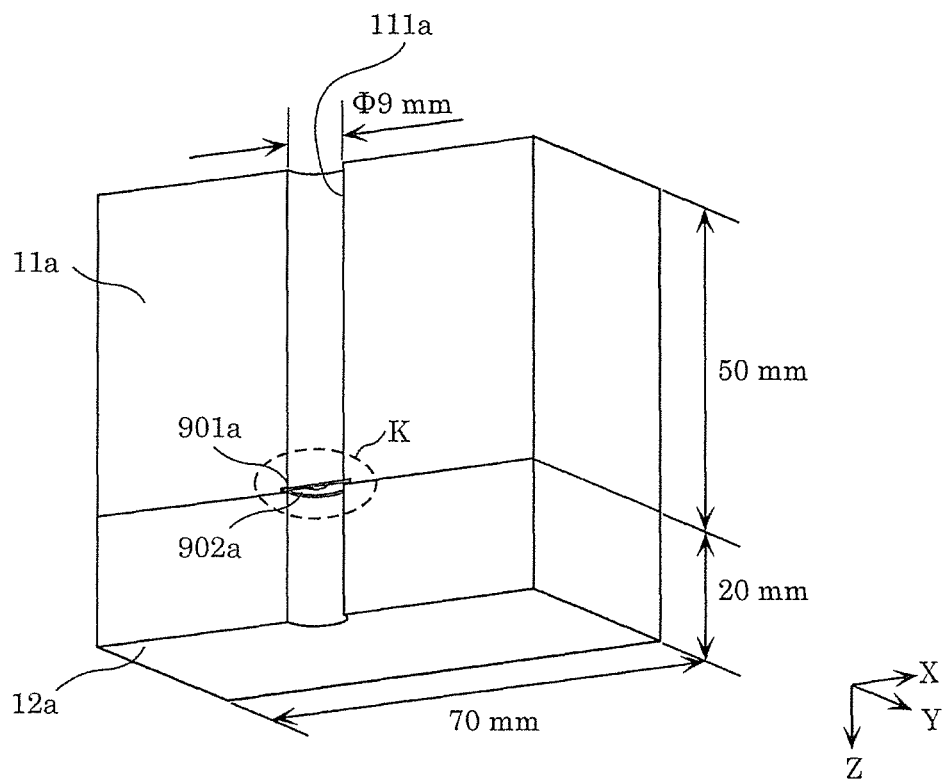
FIG. 5 is a schematic diagram illustrating a Z plane cross-sectional view of the analytical model illustrated in FIG. 4.

FIG. 4 is a schematic diagram illustrating an example of an analytical model of a wavelength conversion device. FIG. 5 is a schematic diagram illustrating a Z plane cross-sectional view of analytical model 1a illustrated in FIG. 4.

Analytical model 1a illustrated in FIG. 4 and FIG. 5 includes: heat-dissipating plate 11a having opening 111a; and heat-dissipating plate 12a having opening 121a, and wavelength conversion device 90a in the comparative example or wavelength conversion device 10a in the working example is disposed (in region K in the figure) between heat-dissipating plate 11a and heat-dissipating plate 12a. Analytical model 1a corresponds to a schematic analytical model of lighting apparatus 1 described above in Embodiment 1. Note that FIG. 5 shows the case where wavelength conversion device 90a in the comparative example is disposed. Heat-dissipating plate 11a is designed to include aluminum A5052 having a thermal conductivity of 138 W/mK and have a size of 20 mm×70 mm with a thickness of 50 mm. Heat-dissipating plate 12a is designed to include aluminum A5052 having a thermal conductivity of 138 W/mK and have a size of 20 mm×70 mm with a thickness of 20 mm. Each of opening 111a and opening 121a is designed to have a size of φ9 mm.

Figure 6:
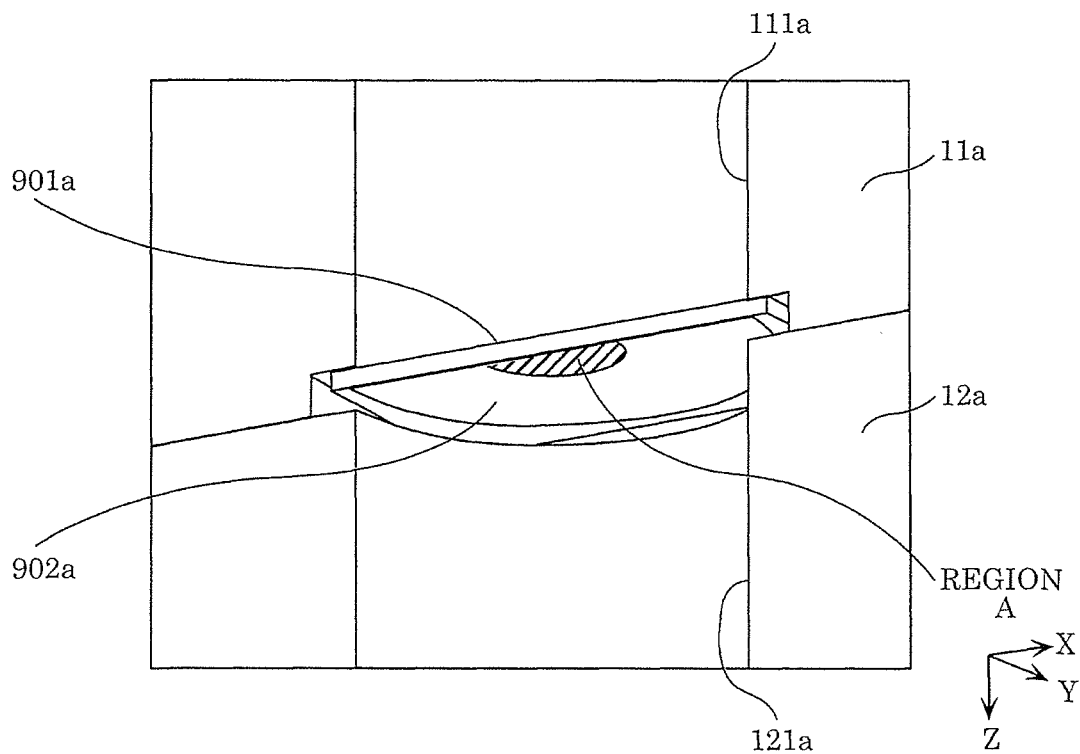
FIG. 6 is a diagram for describing an analytical model of a wavelength conversion device in a comparative example.

FIG. 6 is a diagram for describing an analytical model of wavelength conversion device 90a in the comparative example. Wavelength conversion device 90a in the comparative example illustrated in FIG. 6 includes first substrate 901a and phosphor layer 902a, and the analytical model assumes the case where the blue laser light is emitted thereto. Wavelength conversion device 90a in the comparative example corresponds to the analytical model of wavelength conversion device 90 in the comparative example described above in Embodiment 1. Here, first substrate 901a is designed to be formed of a sapphire substrate having a thermal conductivity of 42 W/mK and have a size of 10 mm×10 mm with a thickness of 0.3 mm. Phosphor layer 902a is designed to have an equivalent thermal conductivity of 3 W/mK and have a thickness of φ9 mm with a thickness of 0.03 mm. Heat-dissipating plates 11a and 12a and first substrate 901a are brought into contact with each other via silver paste having a thermal conductivity of 5 W/mK. Note that FIG. 6 schematically illustrates region A on phosphor layer 902a irradiated with the blue laser light.

Figure 7:
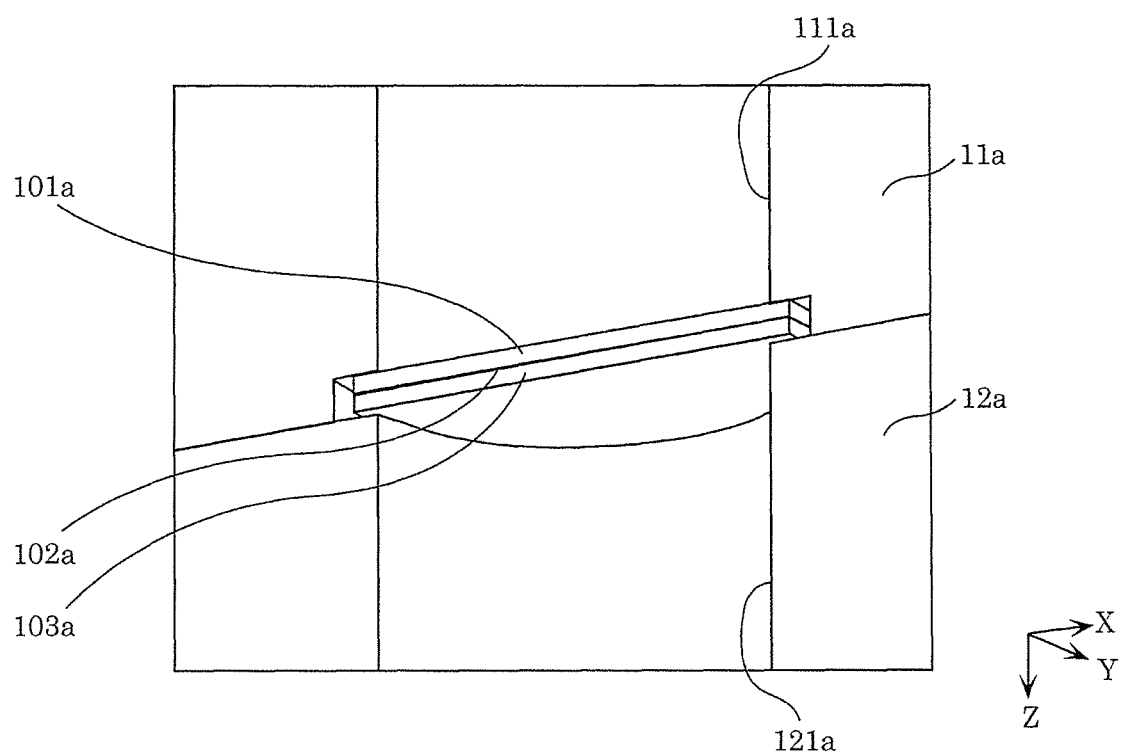
FIG. 7 is a diagram for describing an analytical model of a wavelength conversion device in a working example.

FIG. 7 is a diagram for describing an analytical model of wavelength conversion device 10a in this working example. Wavelength conversion device 10a in the working example illustrated in FIG. 7 includes first substrate 101a, phosphor layer 102a, and second substrate 103a, and the analytical model assumes the case where the blue laser light is emitted thereto. Wavelength conversion device 10a in the working example corresponds to the analytical model of wavelength conversion device 10 described above in Embodiment 1. Here, similar to first substrate 901, each of first substrate 101a and second substrate 103a is designed to be formed of a sapphire substrate having a thermal conductivity of 42 W/mK and have a size of 10 mm×10 mm with a thickness of 0.3 mm. Similar to phosphor layer 902a, phosphor layer 102a is designed to have an equivalent thermal conductivity of 3 W/mK and have a thickness of φ9 mm with a thickness of 0.03 mm. Heat-dissipating plate 11a and first substrate 101a is brought into contact with heat-dissipating plate 12a and second substrate 103a via silver paste having a thermal conductivity of 5 W/mK.

[Analysis Results]

Next, analysis results obtained through a simulation will be described. In a simulation, analytical model 1a is placed in an environment at a temperature of 30° C. in the state where a laser diode emits blue laser light, and the temperature of the phosphor layer in a steady state where the temperature of each portion of analytical model 1a substantially has a constant value (that is, the state where the temperature of each portion is saturated) is analyzed (evaluated).

Figure 8A:
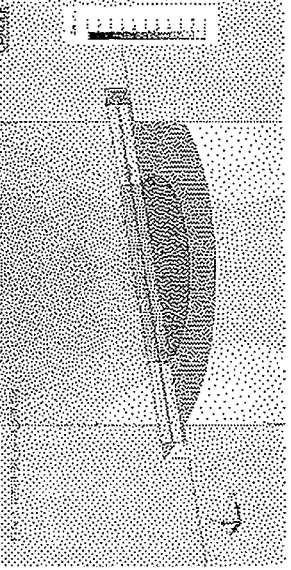
FIG. 8A is a diagram for describing temperature distributions on a cross-section of wavelength conversion devices in a working example and a comparative example.
Figure 8A:
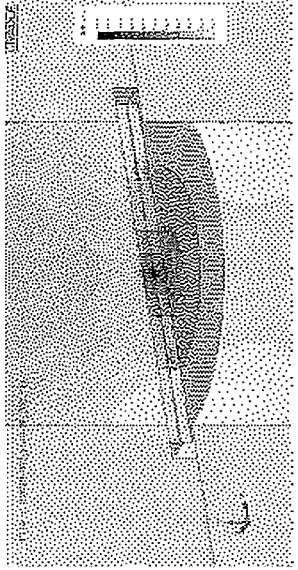
Figure 8A:
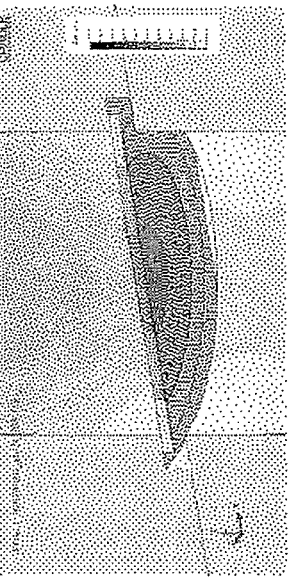
Figure 8A:
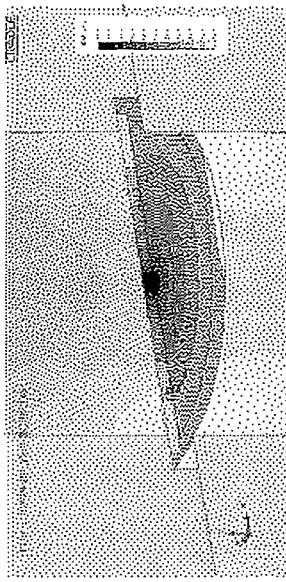
Figure 9:
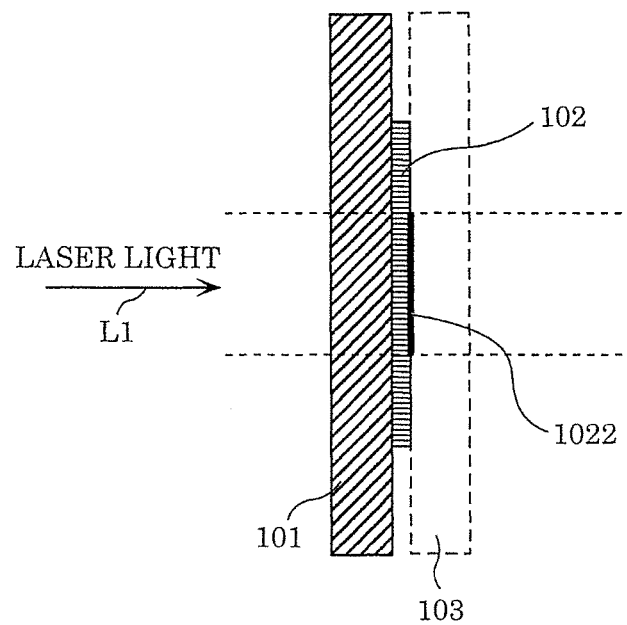
FIG. 9 is a diagram for describing a laser irradiation power density.

FIG. 8A is a diagram for describing temperature distributions on a cross-section of the wavelength conversion devices in the working example and the comparative example. FIG. 8B is a partial enlarged view of FIG. 8A. FIG. 9 is a diagram for describing a laser irradiation power density. In FIG. 8A and FIG. 8B, the temperature distributions on the cross-section of the wavelength conversion devices in the working example and the comparative example in which the incidence spot diameter of the blue laser light is φ0.3 mm and φ7 mm, in other words, the laser irradiation power density is 21.76 W/mm$^2$ and 0.04 W/mm$^2$, are illustrated as analysis results obtained through the simulation. It is assumed that the phosphor layer has a heat value of 1 W. Here, the laser irradiation power density is a value obtained by dividing the energy [W] of blue laser light L1 emitted from the laser diode, as illustrated in FIG. 9, by the area [mm$^2$] of the emission side (laser irradiation area 1022) of phosphor layer 102 which is irradiated with the blue laser light. This laser irradiation power density can be derived from a) the output [W] of the laser diode and b) the spot diameter [mm].

As illustrated in FIG. 8A and FIG. 8B, when the laser irradiation power density is 21.76 W/mm$^2$, the highest value of the temperature of phosphor layer 102a in the working example is 90.66 degrees, and the highest value of the temperature of phosphor layer 902a in the comparative example is 176.16 degrees. When the laser irradiation power density is 0.04 W/mm$^2$, the highest value of the temperature of phosphor layer 102a in the working example is 41.82 degrees, and the highest value of the temperature of phosphor layer 902a in the comparative example is 46.18 degrees.

Figure 10:
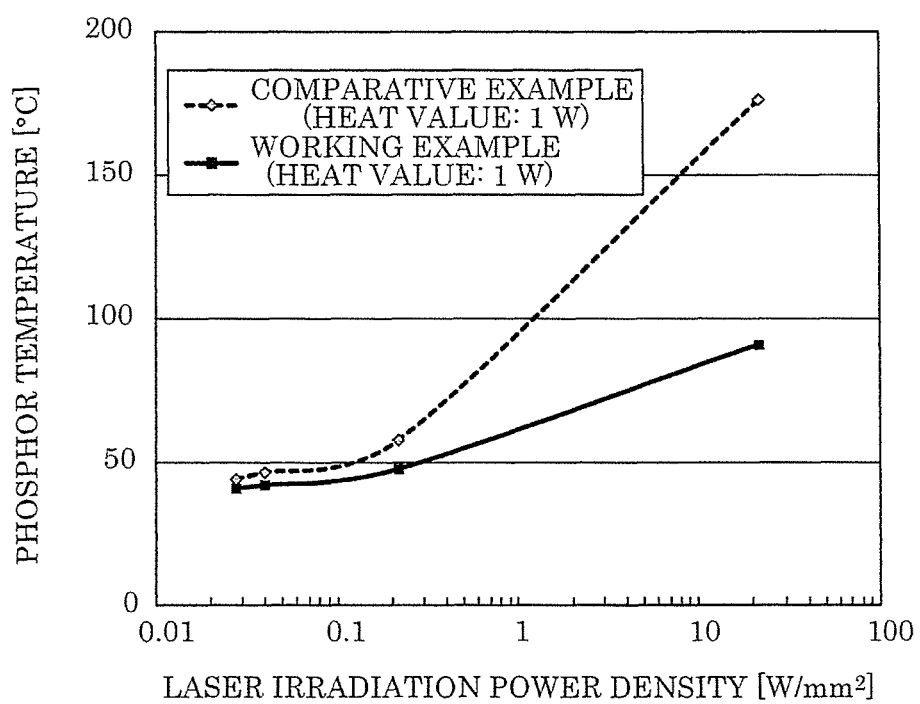
FIG. 10 is a diagram illustrating an example of analysis results in a working example and a comparative example in the case where a phosphor layer has a heat value of 1 W.

FIG. 10 is a diagram illustrating an example of analysis results in the working example and the comparative example in the case where the phosphor layer has a heat value of 1 W. The graph illustrated in FIG. 10 is obtained by connecting plotted temperatures of the phosphor layer obtained when the spot diameter of the blue laser light is φ0.3 mm, φ3 mm, φ7 mm, and φ8.41 mm, in other words, the laser irradiation power density is 21.76 W/mm$^2$, 0.22 W/mm$^2$, 0.04 W/mm$^2$, and 0.03 W/mm$^2$.

FIG. 10 shows that when the laser irradiation power density is at least 0.03 W/mm$^2$, the temperature of phosphor layer 102a in wavelength conversion device 10a according to the working example is lower than that of phosphor layer 902a in wavelength conversion device 90a according to the comparative example. This shows that by using the blue laser light having a laser irradiation power density of at least 0.03 W/mm$^2$, the rise in temperature of phosphor layer 102a can be further suppressed. Furthermore, the graph of the working example illustrated in FIG. 10 shows that the heat dissipation effect of wavelength conversion device 10a increases as the laser irradiation power density increases, in other words, the spot diameter (incidence spot diameter) of the laser light which is emitted to first substrate 101a is reduced. An inflection point is found in the vicinity of the laser irradiation power density of 0.22 W/mm$^2$, showing that by using the blue laser light having laser irradiation power density of 0.22 W/mm$^2$, the rise in temperature of phosphor layer 102a can be further suppressed.

Figure 11:
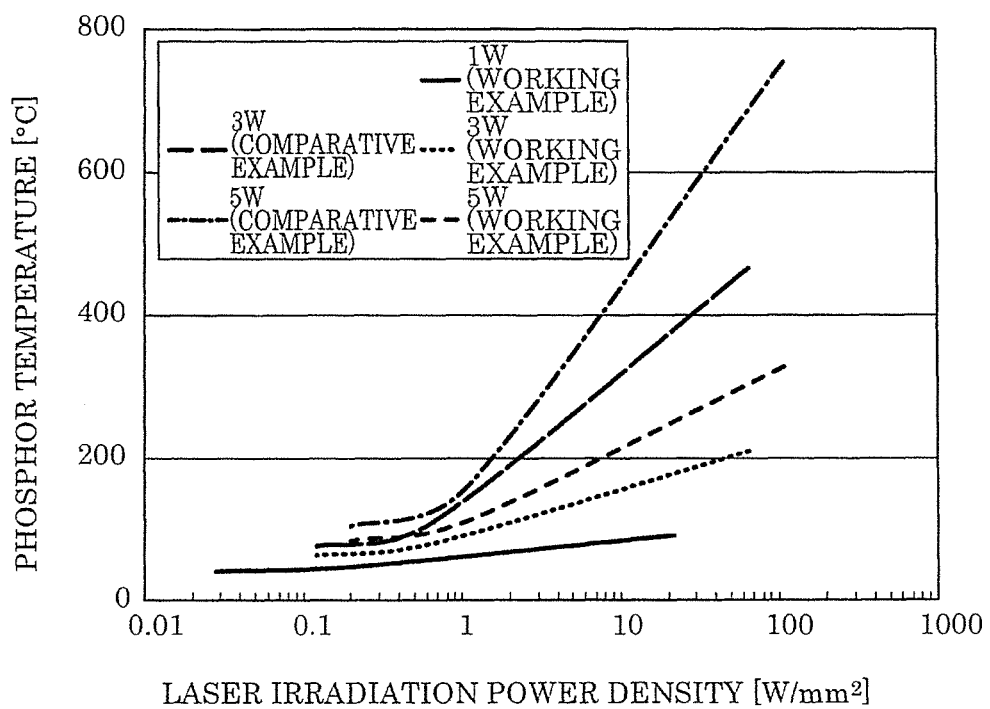
FIG. 11 is a diagram illustrating an example of analysis results in a working example and a comparative example in the case where a phosphor layer has heat values of 3 W and 5 W.

FIG. 11 is a diagram illustrating an example of analysis results in the working example and the comparative example in the case where the phosphor layer has heat values of 3 W and 5 W. FIG. 11 illustrates the relationship between the laser irradiation power density and the phosphor temperature in the working example and the comparative example in the case where the phosphor layer has heat values of 3 W and 5 W. Furthermore, FIG. 11 illustrates the relationship between the laser irradiation power density and the phosphor temperature in the working example in the case where the phosphor layer has a heat value of 1 W. Similar to FIG. 10, the graph illustrated in FIG. 11 is obtained by connecting plotted temperatures of the phosphor layer obtained when the spot diameter of the blue laser light is φ0.3 mm, φ3 mm, φ7 mm, and φ8.41 mm, in other words, the laser irradiation power density is 21.76 W/mm², 0.22 W/mm², 0.04 W/mm², and 0.03 W/mm².

FIG. 11 shows the same findings as with FIG. 10. Specifically, FIG. 11 shows that when the laser irradiation power density is at least 0.03 W/mm², the temperature of phosphor layer 102a in wavelength conversion device 10a according to the working example is lower than that of phosphor layer 902a in wavelength conversion device 90a according to the comparative example. Furthermore, FIG. 11 shows that the heat dissipation effect of wavelength conversion device 10a increases as the laser irradiation power density increases, in other words, the spot diameter (incidence spot diameter) of the laser light which is emitted to first substrate 101a is reduced. An inflection point is found in the vicinity of the laser irradiation power density of 0.22 W/mm², showing that by using the blue laser light having a laser irradiation power density of 0.22 W/mm², the rise in temperature of phosphor layer 102a can be further suppressed.

The above analysis results show that in this embodiment, by using the blue laser light having a laser irradiation power density of at least 0.03 W/mm², the rise in temperature of phosphor layer 102a can be further suppressed. Note that the blue laser light having a laser irradiation power density of at least 0.22 W/mm² may be used.

Embodiment 2

Another problem with the technique disclosed in PTL 1 is that accurately managing the thickness of the phosphor layer is difficult. Stated differently, in related art such as that disclosed in PTL 1, there is the problem that the thickness of the phosphor layer varies among LEDs. Therefore, in the case where a lighting apparatus in which the laser light source is used as the solid-state light source is produced using the related art such as that disclosed in PTL 1, the emission spectrum of the phosphor layer varies according to variation in the thickness of the phosphor layer among lighting apparatuses.

In this embodiment, a wavelength conversion device for laser light which is capable of reducing variation in the thickness of a phosphor layer and a lighting apparatus using the wavelength conversion device for laser light will be further described.

[Lighting Apparatus]

Hereinafter, a lighting apparatus will be described first as an example of an application product using a wavelength conversion device in this embodiment.

Figure 12:
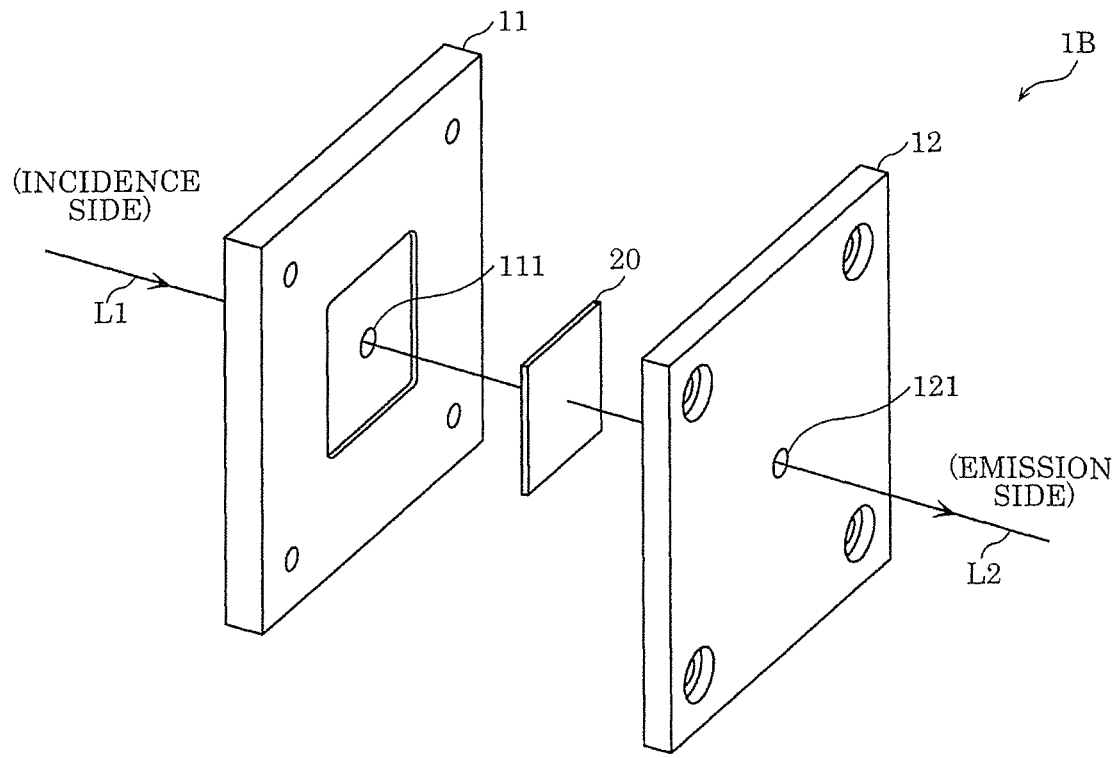
FIG. 12 is a diagram illustrating an example of a lighting apparatus in which a wavelength conversion device in Embodiment 2 is used.
Figure 13:
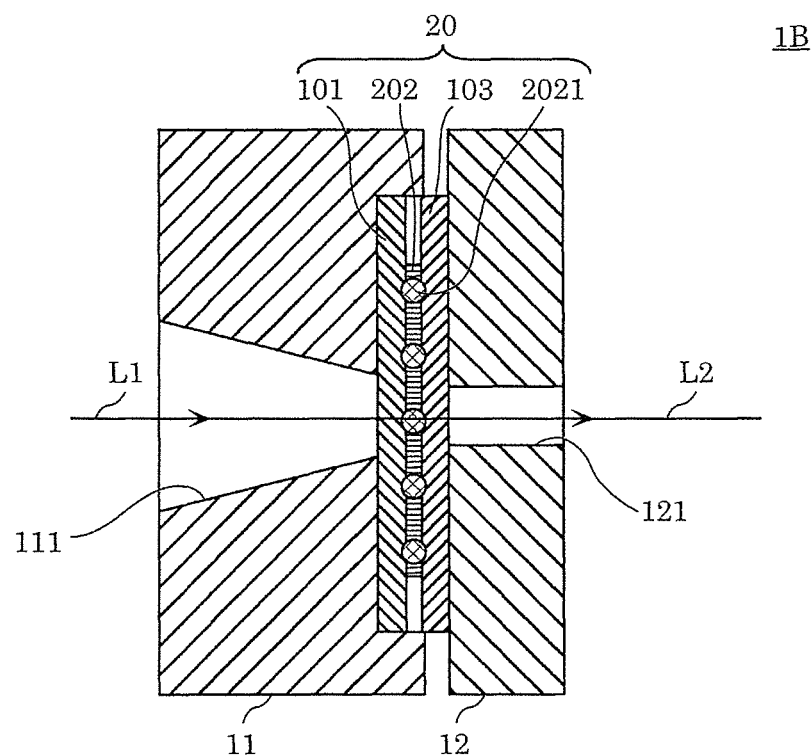
FIG. 13 is a cross-sectional view of the lighting apparatus illustrated in FIG. 12.

FIG. 12 is a diagram illustrating an example of lighting apparatus 1B in which wavelength conversion device 20 in this embodiment is used. FIG. 13 is a cross-sectional view of the lighting apparatus illustrated in FIG. 12. Note that the same numerical reference marks are assigned to components that are the same as or similar to those in FIG. 1 and FIG. 2.

Lighting apparatus 1B illustrated in FIG. 12 is used, for example, for an endoscope, a fiberscope, a spotlight, or a fishing net, produces white light from laser light having a predetermined wavelength included in a wavelength range from ultraviolet light to visible light, and emits the white light.

In this embodiment, lighting apparatus 1B includes wavelength conversion device 20, heat-dissipating plate 11, and heat-dissipating plate 12. A solid-state light source is a laser light source which emits blue laser light as the laser light having a predetermined wavelength.

[Heat-Dissipating Plate 11]

Heat-dissipating plate 11 is a component that has opening 111 in a position overlapping a portion of wavelength conversion device 20 at which phosphor layer 202 is provided and dissipates, to the outside of lighting apparatus 1B, heat generated at wavelength conversion device 20. Heat-dissipating plate 11 is disposed in surface contact with wavelength conversion device 20, at the end of lighting apparatus 1B (on the incidence side in the figure) on which laser light (L1 in the figure) is incident. Heat-dissipating plate 11 is formed, for example, using a material having a high thermal conductivity such as Al. Note that a surface of heat-dissipating plate 11 may be formed having ridges and grooves. This is because it is possible to improve the efficiency in dissipating heat to the outside of lighting apparatus 1B by increasing the surface area of heat-dissipating plate 11.

Opening 111 is for allowing laser light emitted from the laser light source which is a solid-state light source to pass to wavelength conversion device 20. Opening 111 is located on an optical path of the laser light emitted from the laser light source. In this way, the laser light emitted from the laser light source can reach wavelength conversion device 20 through opening 111.

[Heat-Dissipating Plate 12]

Heat-dissipating plate 12 is a component that has opening 121 in a position overlapping the portion of wavelength conversion device 20 at which phosphor layer 202 is provided and dissipates, to the outside of lighting apparatus 1B, heat generated at wavelength conversion device 20. Heat-dissipating plate 12 is disposed in surface contact with wavelength conversion device 20, at the end (on the emission side in the figure) on which white light (L2 in the figure) is emitted, and heat-dissipating plate 12 is formed, for example, using a material having a high thermal conductivity such as Al. Note that a surface of heat-dissipating plate 12 may be formed having ridges and grooves. This is because it is possible to improve the efficiency in dissipating heat to the outside of lighting apparatus 1B by increasing the surface area of heat-dissipating plate 12.

Opening 121 is for allowing passage of the white light emitted from wavelength conversion device 20 so that the white light is emitted to the outside of lighting apparatus 1B. Opening 121 is located on an optical path of the laser light emitted from the laser light source. In this way, the white light emitted from wavelength conversion device 20 can be emitted to the outside of lighting apparatus 1B through opening 121.

[Wavelength Conversion Device 10]

Figure 14:
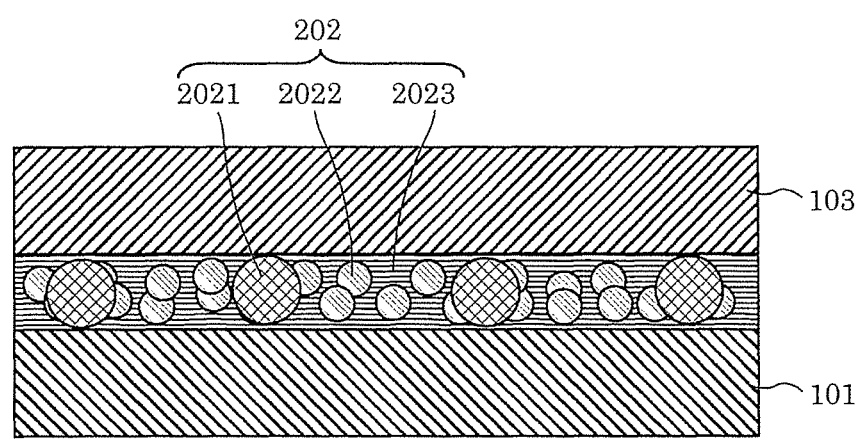
FIG. 14 is a cross-sectional view of a wavelength conversion device in Embodiment 2.

FIG. 14 is a cross-sectional view of wavelength conversion device 20 in this embodiment.

As illustrated in FIG. 13 and FIG. 14, wavelength conversion device 20, which is a wavelength conversion device for laser light, includes first substrate 101, phosphor layer 202, and second substrate 103. Furthermore, wavelength conversion device 20 includes a gap-maintaining component which adjusts the thickness of phosphor layer 202 between first substrate 101 and second substrate 103. Note that when lighting apparatus 1B is used for an endoscope or the like, wavelength conversion device 20 corresponds to a light source means which uses laser light.

(First Substrate 101)

First substrate 101 is irradiated with laser light that has been emitted from the laser light source and passed through opening 111 of heat-dissipating plate 11. First substrate 101 includes a portion on which phosphor layer 202 is provided. The case where phosphor layer 202 is provided on first substrate 101 by being applied to first substrate 101 will be described as an example, but the method for providing phosphor layer 202 on first substrate 101 is not limited to this example.

First substrate 101 is light-transmissive. Here, first substrate 101 may be transparent with no light absorption. In other words, first substrate 101 may be formed from a material having a substantially 0 extinction coefficient. This is because the amount of laser light transmitted by first substrate 101 can increase accordingly, and, as a result, the amount of light emitted from lighting apparatus 1B to the surroundings thereof can increase.

The thermal conductivity of first substrate 101 is higher than the thermal conductivity of phosphor layer 202. As the material forming first substrate 101, it is possible to use any light-transmissive material having a thermal conductivity higher than that of phosphor layer 202 such as sapphire, ZnO single crystal, AlN, $Y_2O_3$, SiC, polycrystalline alumina, and GaN.

(Second Substrate 103)

Second substrate 103 includes a portion on which phosphor layer 202 is provided and is irradiated with white light emitted from phosphor layer 202. Second substrate 103 allows the emitted white light to pass therethrough and be emitted to opening 112 of heat-dissipating plate 12.

Second substrate 103 is light-transmissive. Here, second substrate 103 may be transparent with no light absorption. In other words, second substrate 103 may be formed from a material having a substantially 0 extinction coefficient. This is because the amount of white light transmitted by second substrate 103 can increase accordingly, and, as a result, the amount of light emitted from lighting apparatus 1B to the surroundings thereof can increase.

The thermal conductivity of second substrate 103 is higher than the thermal conductivity of phosphor layer 202. As the material forming second substrate 103, it is possible to use any light-transmissive material having a thermal conductivity higher than that of phosphor layer 202 such as sapphire, ZnO single crystal, AlN, $Y_2O_3$, SiC, polycrystalline alumina, and GaN.

(Phosphor Layer 202)

Phosphor layer 202 is provided between and in surface contact with first substrate 101 and second substrate 103. Phosphor layer 202 includes phosphor 2022 which converts the wavelength of the laser light having a predetermined wavelength emitted thereto from the laser light source. Note that phosphor layer 202 generates heat at the time of color conversion of light. Here, the gap-maintaining component is a plurality of light-transmissive thickness adjustment particles 2021 having substantially equal diameters, and the plurality of thickness adjustment particles 2021 are contained in phosphor layer 202.

In this embodiment, phosphor layer 202 has a wavelength-converting function of converting the color (wavelength) of laser light. More specifically, phosphor layer 202 receives the blue laser light emitted from the laser light source, produces white light that is obtained through the color mixing of yellow light resulting from conversion of part of the received blue laser light by phosphor 2022 and the remaining part of said blue laser light, and emits the white light. As illustrated in FIG. 13 and FIG. 14, phosphor layer 202 is formed in a tabular shape, for example, and contains the plurality of thickness adjustment particles 2021, the plurality of phosphors 2022, and sealing resin 2023.

Phosphor 2022 receives the blue laser light emitted from the laser light source and emits the yellow light. The plurality of phosphor 2022 are, for example, yttrium aluminum garnet (YAG) phosphor particles.

Sealing resin 2023 is a resin such as silicone or liquid glass and seals phosphor 2022 in phosphor layer 202. Furthermore, sealing resin 2023 seals thickness adjustment particles 2021. Note that sealing resin 2023 may be mixed with a material having a high thermal conductivity, for example, an inorganic oxide such as ZnO to enhance heat dissipation.

The plurality of thickness adjustment particles 2021 are light-transmissive and have substantially equal diameters. The plurality of thickness adjustment particles 2021 include, for example, any of silica beads, which consist of silica, silicone beads, which consist of silicone, and glass beads, which consist of glass. Note that the plurality of thickness adjustment particles 2021 may have any shape, as long as they have equal diameters in one direction, including the form of spheres, the form of oval spheres, the form of flake, the form of wires, and the form of rods.

Here, in this embodiment, the refractive index of each of the plurality of thickness adjustment particles 2021 is the same as that of sealing resin 2023. Note that the same refractive index in this embodiment means that the refractive index difference is within ±0.1. Therefore, the plurality of thickness adjustment particles 2021 can be arranged uniformly, randomly, or generally sparsely in phosphor layer 202. As a result of being sandwiched between first substrate 101 and second substrate 103, the plurality of thickness adjustment particles 2021 can accurately maintain the distance between first substrate 101 and second substrate 103 at a uniform distance that is the thickness (diameter) of thickness adjustment particle 2021. In this way, the thickness of phosphor layer 202 which is sandwiched between first substrate 101 and second substrate 103 can be made uniform.

Note that the gap-maintaining component is not limited to the plurality of thickness adjustment particles 2021 described above. For example, the gap-maintaining component may be a wire-shaped, ring-shaped, or protruding thickness adjustment object that is light-transmissive and has a uniform thickness along the thickness of phosphor layer 202 as long as the thickness adjustment object can adjust the thickness of phosphor layer 202 to a uniform thickness. In this case, the thickness adjustment object may be made of a material that is the same as or similar to that of thickness adjustment particle 2021 described above. The wire-shaped, ring-shaped, or protruding thickness adjustment object will be described later, and therefore specific description thereof will be omitted here.

[Advantageous Effects, Etc.]

As described above, in this embodiment, phosphor layer 202 contains thickness adjustment particle 2021. With this, even when wavelength conversion device 20 is produced by applying phosphor layer 202 containing thickness adjustment particle 2021 to first substrate 101 in such a manner that phosphor layer 202 is sandwiched between first substrate 101 and second substrate 103, the distance between first substrate 101 and second substrate 103 can be accurately maintained at a uniform distance that is the thickness (diameter) of thickness adjustment particle 2021. Thus, since the distance between first substrate 101 and second substrate 103 can be accurately maintained at a uniform distance, the thickness of phosphor layer 202 sandwiched between first substrate 101 and second substrate 103 can be accurately made uniform. Accordingly, phosphor layer 202 can be uniformly formed without variation in thickness among wavelength conversion devices 20.

In this manner, in this embodiment, it is possible to provide wavelength conversion device 20 for laser light which is capable of reducing variation in the thickness of phosphor layer 202 and lighting apparatus 113B using wavelength conversion device 20 for laser light.

Figure 15:
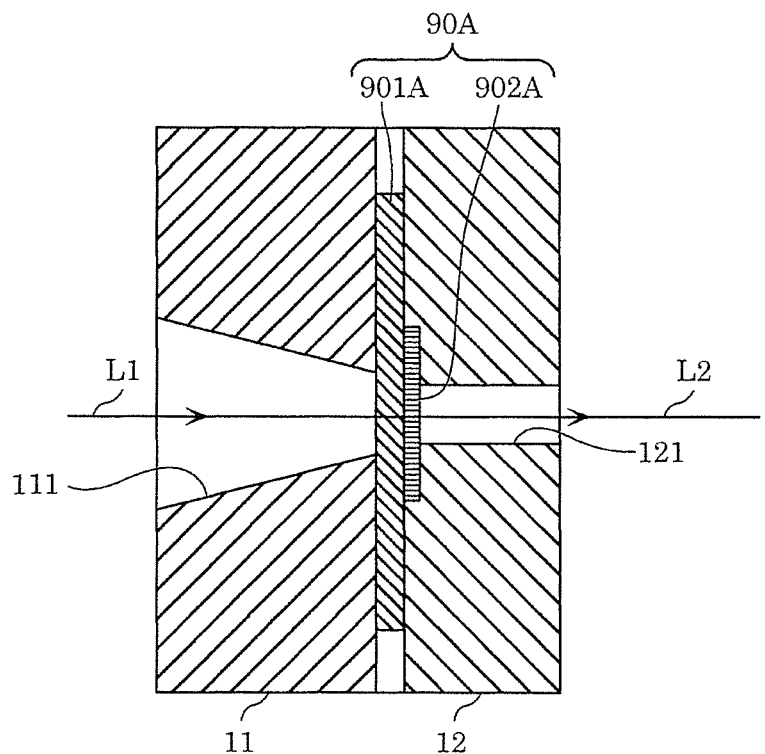
FIG. 15 is a cross-sectional view of a lighting apparatus in which a wavelength conversion device in Comparative Example 1 of Embodiment 2 is used.
Figure 16:
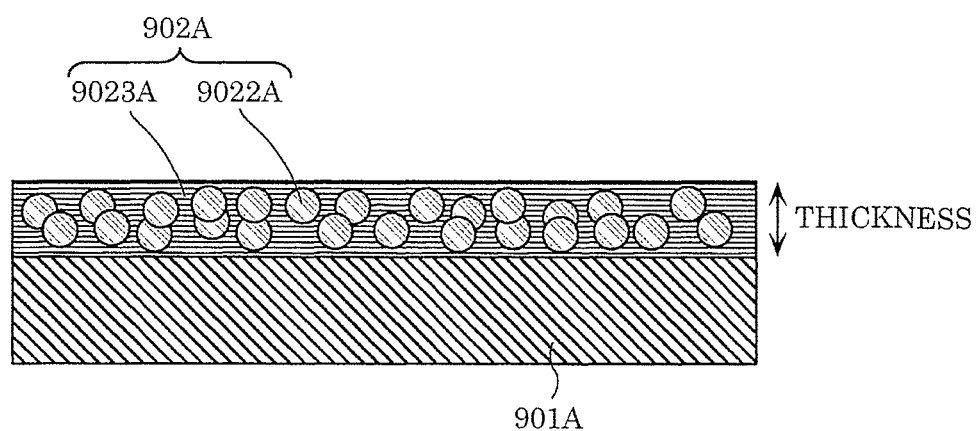
FIG. 16 is a cross-sectional view of a wavelength conversion device in Comparative Example 1 of Embodiment 2.

Here, the advantageous effects of wavelength conversion device 20 according to this embodiment will be described with reference to FIG. 15 and FIG. 16. FIG. 15 is a cross-sectional view of a lighting apparatus in which wavelength conversion device 90A in Comparative Example 1 of Embodiment 2 is used. FIG. 16 is a cross-sectional view of wavelength conversion device 90A in Comparative Example 1 of Embodiment 2. Note that the same numerical reference marks are assigned to components that are the same as or similar to those in FIG. 13, and detailed description thereof will be omitted.

In Comparative Example illustrated in FIG. 15 and FIG. 16, an example of wavelength conversion device 90A including first substrate 901A and phosphor layer 902A is illustrated. Here, first substrate 901A is light-transmissive and includes a portion coated by phosphor layer 902A. As the material forming first substrate 901A, it is possible to use any material such as sapphire, ZnO single crystal, AlN, $Y_2O_3$, SiC, polycrystalline alumina, and GaN, similar to the case of first substrate 101. Phosphor layer 902A is provided on first substrate 901A. Phosphor layer 902A includes: phosphor 9022A which converts the wavelength of laser light having a predetermined wavelength emitted from laser light source; and sealing resin 9023A which seals phosphor 9022A. In other words, wavelength conversion device 90A in Comparative Example 1 does not include the second substrate, but includes only first substrate 901A, and furthermore, phosphor layer 902A does not contain the thickness adjustment particle. Therefore, the thickness of phosphor layer 902A provided on first substrate 901A cannot be accurately made uniform, and thus there is the problem that the thickness of phosphor layer 902A varies among wavelength conversion devices 90A. This causes the problem of the emission spectrum of phosphor layer 902A changing at the time of conversion of the wavelength of the laser light emitted by the laser light source due to variation in the thickness of phosphor layer 902A among wavelength conversion devices 90A in Comparative Example 1.

In contrast, for example, phosphor layer 202 in this embodiment illustrated in FIG. 13 and FIG. 14 contains the plurality of thickness adjustment particles 2021 which are light-transmissive and have substantially equal diameters, and is provided between and in surface contact with first substrate 101 and second substrate 103. This means that the thickness of thickness adjustment particle 2021 allows the distance between first substrate 101 and second substrate 103 to be accurately maintained at a uniform distance; thus, the thickness of phosphor layer 202 can be made uniform by the thickness of thickness adjustment particle 2021.

In this way, phosphor layer 202 can be uniformly formed without variation in thickness among wavelength conversion devices 20, and thus variation in the emission spectrum of phosphor layer 202 among wavelength conversion devices 20 can be reduced. As a result, wavelength conversion device 20 according to this embodiment produces the advantageous effect of stably producing white light without individual differences.

As described above, wavelength conversion device 20 according to this embodiment is a wavelength conversion device for laser light and includes: first substrate 101 which is light-transmissive; second substrate 103 which is light-transmissive; and phosphor layer 202 which is provided between and in surface contact with first substrate 101 and second substrate 103, and includes phosphor 2022 which converts the wavelength of laser light having a predetermined wavelength emitted from a laser light source, and further includes, between first substrate 101 and second substrate 103, a gap-maintaining component which adjusts the thickness of phosphor layer 202. The thermal conductivity of each of first substrate 101 and second substrate 103 is higher than the thermal conductivity of phosphor layer 202.

With this, phosphor layer 202 can maintain the distance between first substrate 101 and second substrate 103 at a uniform distance, and thus variation in the thickness of phosphor layer 202 can be reduced.

Here, the gap-maintaining component is the plurality of light-transmissive thickness adjustment particles 2021 having substantially equal diameters, and the plurality of thickness adjustment particles 2021 are contained in phosphor layer 202.

With this, phosphor layer 202 can maintain the distance between first substrate 101 and second substrate 103 at a uniform distance by the thickness (diameter) of thickness adjustment particle 2021, and thus variation in the thickness of phosphor layer 202 can be reduced. This produces the advantageous effect of being able to reduce variation in the emission spectrum in the case of converting the wavelength of the laser light emitted by the laser light source.

Here, the refractive index of each of the plurality of thickness adjustment particles 2021 is the same as that of sealing resin 2023 which seals phosphor 2022 in phosphor layer 202.

With this, thickness adjustment particle 2021 does not deflect or reflect, at the boundary or the like between thickness adjustment particle 2021 and sealing resin 2023, the laser light emitted to phosphor layer 202. Stated differently, the impact thickness adjustment particle 2021 has on the behavior of the laser light emitted to phosphor layer 202 is equivalent to the impact sealing resin 2023 has thereon. Therefore, phosphor layer 202 can contain thickness adjustment particles 2021 uniformly, randomly, or sparsely throughout phosphor layer 202.

The plurality of thickness adjustment particles 2021 include, for example, any of silica beads, which consist of silica, silicone beads, which consist of silicone, and glass beads, which consist of glass.

With this, it is possible to produce the plurality of thickness adjustment particles 2021 which are light-transmissive and have substantially equal diameters.

The gap-maintaining component may be a wire-shaped, ring-shaped, or protruding thickness adjustment object that is light-transmissive and has a uniform thickness along the thickness of phosphor layer 202.

With this, phosphor layer 202 can maintain the distance between first substrate 101 and second substrate 103 at a uniform distance, and thus variation in the thickness of phosphor layer 202 can be reduced.

The laser light source emits blue laser light as the laser light having a predetermined wavelength. Phosphor layer 202 converts the wavelength of part of the blue laser light into light in a wavelength range representing yellow light.

With this, wavelength conversion device 20 can produce white light by converting the wavelength of the blue laser light.

(Variation)

In Embodiment 2 described above, the sealing resin and the thickness adjustment particle included in the phosphor layer have the same refractive index, but this is not limiting. The sealing resin and the thickness adjustment particle included in the phosphor layer may have different refractive indices. Hereinafter, an example in this case will be described as a variation, focusing on the points that differ from Embodiment 2.

[Wavelength Conversion Device 20A]

Figures 17, 18:
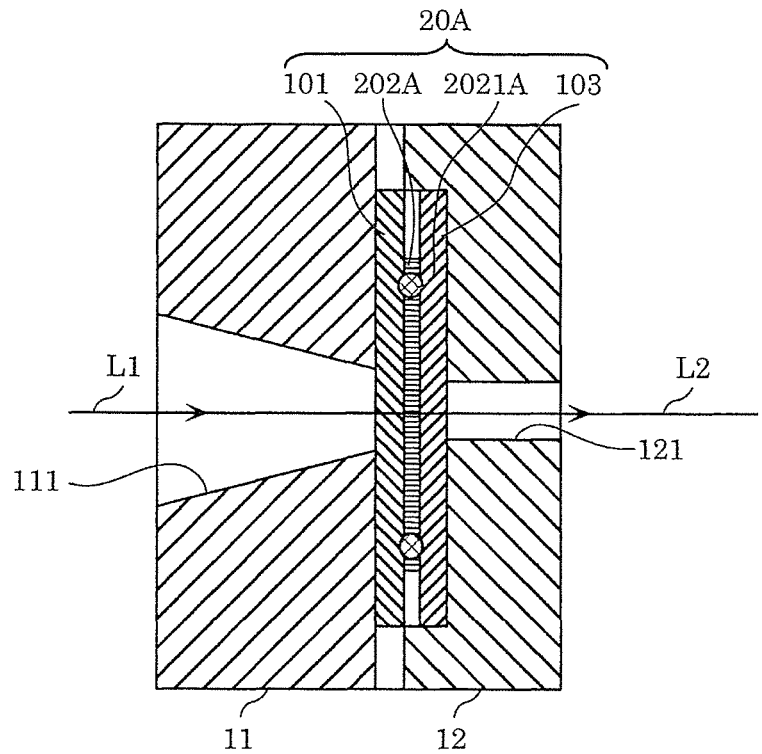
FIG. 17 is a cross-sectional view of an example of a wavelength conversion device in a variation of Embodiment 2.
FIG. 18 is a diagram illustrating an example of materials included in a phosphor layer in a variation of Embodiment 2.
Figure 19:
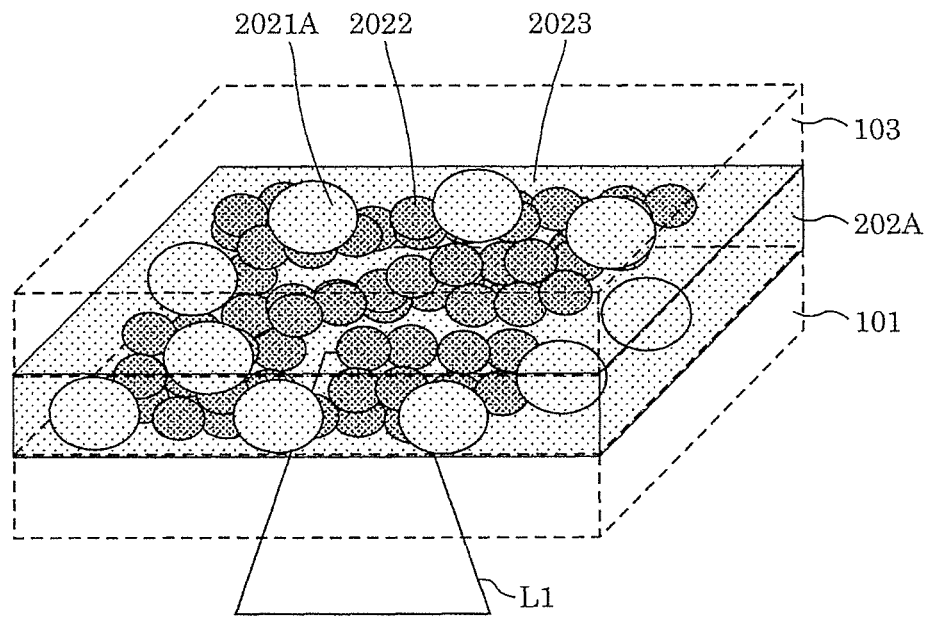
FIG. 19 is a schematic diagram illustrating an arrangement example of thickness adjustment particles contained in the phosphor layer illustrated in FIG. 17.

FIG. 17 is a cross-sectional view of an example of wavelength conversion device 20A in a variation of Embodiment 2. FIG. 18 is a diagram illustrating an example of materials included in phosphor layer 202A in the variation of Embodiment 2. FIG. 19 is a schematic diagram illustrating an arrangement example of thickness adjustment particles 2021A contained in phosphor layer 202A illustrated in FIG. 17. Note that the same numerical reference marks are assigned to components that are the same as or similar to those in FIG. 13 and FIG. 14, and detailed description thereof will be omitted.

Wavelength conversion device 20A illustrated in FIG. 17 is different from wavelength conversion device 20 illustrated in FIG. 13 in terms of the configuration of phosphor layer 202A. Furthermore, wavelength conversion device 20A includes a gap-maintaining component which adjusts the thickness of phosphor layer 202A between first substrate 101 and second substrate 103, as in Embodiment 1.

(Phosphor Layer 202A)

Phosphor layer 202A is provided between and in surface contact with first substrate 101 and second substrate 103. Phosphor layer 202A includes phosphor 2022 which converts the wavelength of the laser light having a predetermined wavelength emitted thereto from the laser light source. Here, the gap-maintaining component is a plurality of light-transmissive thickness adjustment particles 2021A having substantially equal diameters, and the plurality of thickness adjustment particles 2021A are contained in phosphor layer 202A.

Also in this variation, phosphor layer 202A produces white light that is obtained through the color mixing of yellow light resulting from phosphor 2022 converting part of the blue laser light emitted from the laser light source, and the remaining part of said blue laser light, and emits the white light. As illustrated in FIG. 17 and FIG. 19, phosphor layer 202A is formed in a tabular shape, for example, and contains the plurality of thickness adjustment particles 2021A, the plurality of phosphors 2022, and sealing resin 2023. Although described later, the plurality of thickness adjustment particles 2021A illustrated in FIG. 17 and FIG. 19 are different from the plurality of thickness adjustment particles 2021A illustrated in FIG. 13 and FIG. 14 in terms of arrangement in phosphor layer 202A.

As illustrated in FIG. 18, sealing resin 2023 is a resin such as silicone or liquid glass and seals phosphor 2022 in phosphor layer 202A. Furthermore, sealing resin 2023 seals thickness adjustment particles 2021A.

The plurality of thickness adjustment particles 2021A are light-transmissive and have substantially equal diameters. As illustrated in FIG. 18, the plurality of thickness adjustment particles 2021A may be, for example, silica beads, which consist of silica, silicone beads, which consist of silicone, or glass beads, which consist of glass.

In this variation, when sealing resin 2023 includes silicone, for example, each of the plurality of thickness adjustment particles 2021A includes a glass bead or a silica bead. In other words, the refractive index of each of the plurality of thickness adjustment particles 2021A is different from that of sealing resin 2023. This means that thickness adjustment particle 2021A deflects or reflects, at the boundary or the like between thickness adjustment particle 2021A and sealing resin 2023, the laser light emitted to phosphor layer 202A. Specifically, thickness adjustment particle 2021A has an impact on the behavior of the laser light emitted to phosphor layer 202A. Therefore, since phosphor layer 202A has an impact on the behavior of the laser light emitted to phosphor layer 202A, phosphor layer 202A cannot uniformly, randomly, or generally sparsely contain thickness adjustment particles 2021A each having a refractive index difference from that of sealing resin 2023.

In view of this, in this variation, the plurality of thickness adjustment particles 2021A are arranged in positions at least a predetermined distance away from the spot position, on phosphor layer 202A, of the laser light emitted thereto, in top view. Here, the spot position is where the spot diameter of the laser light is present on the irradiation surface of phosphor layer 202A.

For example, in the example illustrated in FIG. 19, the plurality of thickness adjustment particles 2021A are arranged in positions away from the spot position, in a ring pattern centered on the spot position, in top view. Note that the plurality of thickness adjustment particles 2021A may be arranged on phosphor layer 202A other than a region a predetermined distance away from the spot position in top view so that the plurality of thickness adjustment particles 2021A are arranged in positions away from the spot position.

Note that, similar to Embodiment 2 described above, as a result of being sandwiched between first substrate 101 and second substrate 103, the plurality of thickness adjustment particles 2021A can accurately maintain the distance between first substrate 101 and second substrate 103 at a uniform distance that is the thickness (diameter) of thickness adjustment particle 2021A. Thus, the thickness of phosphor layer 202A which is sandwiched between first substrate 101 and second substrate 103 can be made uniform.

[Advantageous Effects, Etc.]

As described above, in this variation, phosphor layer 202A contains thickness adjustment particle 2021A. With this, even when wavelength conversion device 20A is produced by applying phosphor layer 202A containing thickness adjustment particle 2021A to first substrate 101 in such a manner that phosphor layer 202A is sandwiched between first substrate 101 and second substrate 103, the distance between first substrate 101 and second substrate 103 can be accurately maintained at a uniform distance that is the thickness (diameter) of thickness adjustment particle 2021A. Thus, since the distance between first substrate 101 and second substrate 103 can be accurately maintained at a uniform distance, the thickness of phosphor layer 202A sandwiched between first substrate 101 and second substrate 103 can be accurately made uniform. Accordingly, phosphor layer 202A can be uniformly formed without variation in thickness among wavelength conversion devices 20A.

In this manner, in this variation, it is possible to provide wavelength conversion device 20A for laser light which is capable of reducing variation in the thickness of phosphor layer 202A and a lighting apparatus using wavelength conversion device 20A for laser light.

Figure 20:
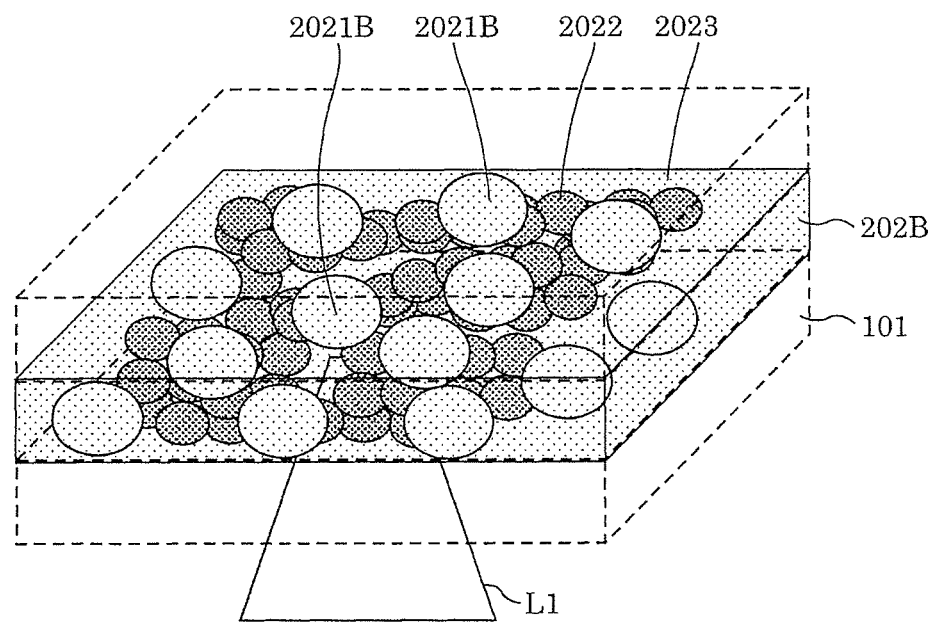
FIG. 20 is a schematic diagram illustrating an arrangement example of thickness adjustment particles contained in a phosphor layer in Comparative Example 2 of Embodiment 2.

Here, the advantageous effects of wavelength conversion device 20A according to this variation will be described with reference to FIG. 20. FIG. 20 is a schematic diagram illustrating an arrangement example of thickness adjustment particles 2021B contained in phosphor layer 202B in Comparative Example 2 of Embodiment 2. The same numerical reference marks are assigned to components that are the same as or similar to those in FIG. 19, and detailed description thereof will be omitted.

In Comparative Example 2 illustrated in FIG. 20, an example is shown in which, when the refractive index of each of the plurality of thickness adjustment particles 2021B is different from that of sealing resin 2023, thickness adjustment particles 2021B are generally sparsely arranged in phosphor layer 202B. Note that thickness adjustment particles 2021B and thickness adjustment particles 2021A are the same except arrangement thereof. In other words, the arrangement of thickness adjustment particles 2021B illustrated in Comparative Example 2 results in thickness adjustment particles 2021B having an impact on the behavior of the laser light emitted to phosphor layer 202B. This is because, since thickness adjustment particle 2021B has a different refractive index from sealing resin 2023, thickness adjustment particle 2021B deflects or reflects, at the boundary or the like between thickness adjustment particle 2021B and sealing resin 2023, the laser light emitted to phosphor layer 202B.

In contrast, in phosphor layer 202A in this variation illustrated in FIG. 19, for example, the plurality of thickness adjustment particles 2021A are arranged in positions at least a predetermined distance away from the spot position, on phosphor layer 202A, of the laser light emitted thereto, in top view. In phosphor layer 202A in this variation, this arrangement makes it possible to prevent thickness adjustment particles 2021A from having an impact on the behavior of the laser light emitted to phosphor layer 202A. This is because, since thickness adjustment particles 2021A are not arranged in a region where yellow light resulting from excitation by one part of the blue laser light emitted to phosphor layer 202B and the other part of the blue laser light that is transmitted are dispersed and mixed, thickness adjustment particles 2021A have no impact on the behavior of light in the region.

As described above, wavelength conversion device 20A according to this variation is a wavelength conversion device for laser light and includes: first substrate 101 which is light-transmissive; second substrate 103 which is light-transmissive; and phosphor layer 202A which is provided between and in surface contact with first substrate 101 and second substrate 103, and includes phosphor 2022 which converts the wavelength of laser light having a predetermined wavelength emitted from a laser light source, and further includes, between first substrate 101 and second substrate 103, a gap-maintaining component which adjusts the thickness of phosphor layer 202A. The thermal conductivity of each of first substrate 101 and second substrate 103 is higher than the thermal conductivity of phosphor layer 202A.

With this, phosphor layer 202A can maintain the distance between first substrate 101 and second substrate 103 at a uniform distance, and thus variation in the thickness of phosphor layer 202A can be reduced.

Here, the gap-maintaining component is a plurality of light-transmissive thickness adjustment particles 2021A having substantially equal diameters, and the plurality of thickness adjustment particles 2021A are contained in phosphor layer 202A.

With this, phosphor layer 202A can maintain the distance between first substrate 101 and second substrate 103 at a uniform distance by the thickness (diameter) of thickness adjustment particle 2021A, and thus variation in the thickness of phosphor layer 202A can be reduced. This produces the advantageous effect of being able to reduce variation in the emission spectrum in the case of converting the wavelength of the laser light emitted by the laser light source.

Here, the refractive index of each of the plurality of thickness adjustment particles 2021A is different from that of sealing resin 2023 which seals phosphor 2022 in phosphor layer 202A. The plurality of thickness adjustment particles 2021A are arranged in positions away from the spot position of the incident laser light on phosphor layer 202A in top view.

With this, it is possible to prevent thickness adjustment particles 2021A from having an impact on the behavior of the laser light emitted to phosphor layer 202A.

For example, the plurality of thickness adjustment particles 2021A may be arranged in positions at least a predetermined distance away from the spot position, in a ring pattern centered on the spot position, in top view. Furthermore, for example, the plurality of thickness adjustment particles 2021A may be arranged on phosphor layer 202A other than a region a predetermined distance away from the spot position in top view so that the plurality of thickness adjustment particles 2021A are arranged in positions the predetermined distance away from the spot position.

In this way, thickness adjustment particles 2021A are not arranged in the region where the laser light emitted to phosphor layer 202A exists, and thus have no impact on the behavior of light in the region. This means that it is possible to prevent thickness adjustment particles 2021A from having an impact on the behavior of the laser light emitted to phosphor layer 202A.

Figure 21:
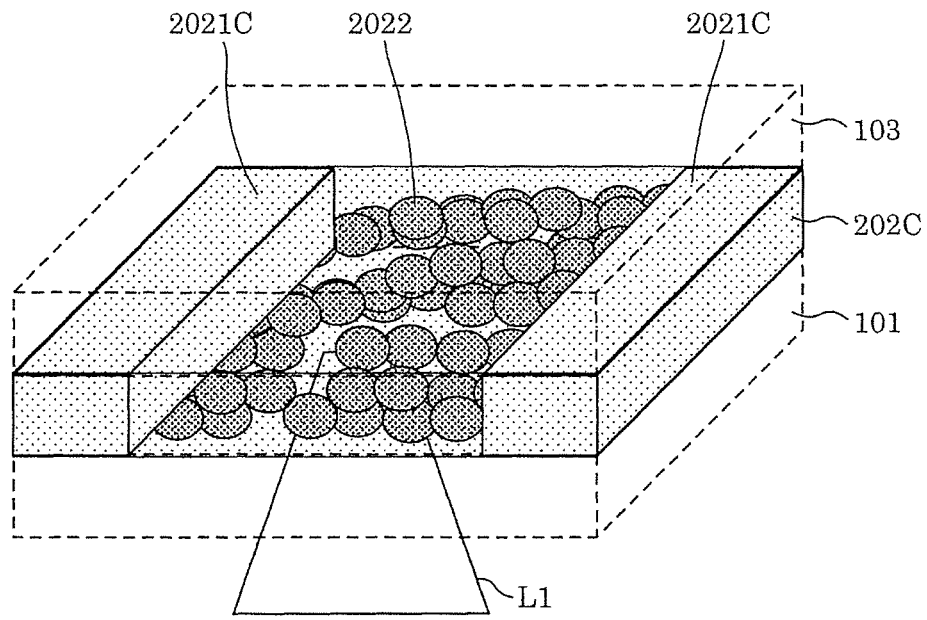
FIG. 21 is a schematic diagram illustrating another example of a gap-maintaining component in a variation of Embodiment 2.
Figure 22:
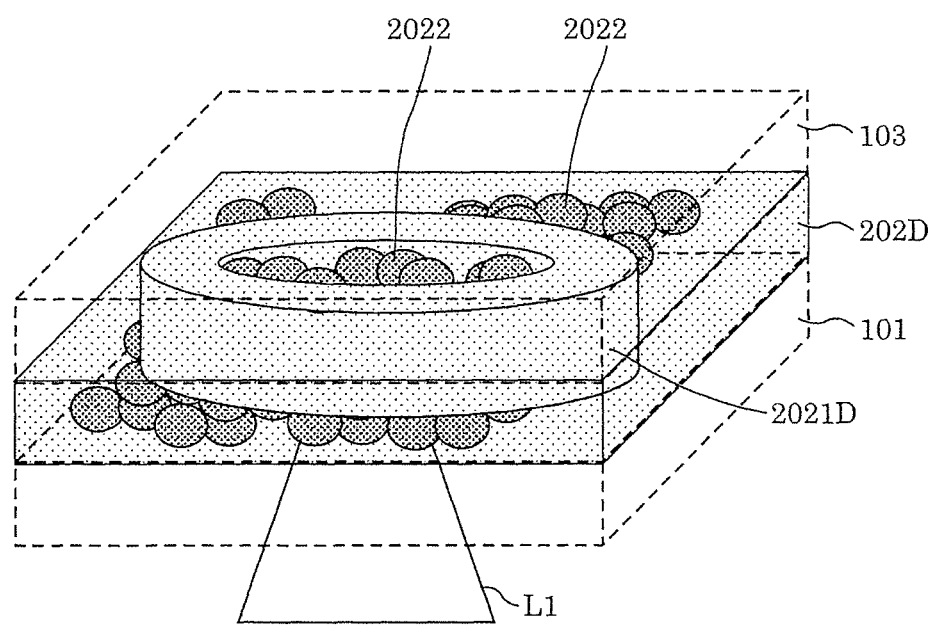
FIG. 22 is a schematic diagram illustrating another example of a gap-maintaining component in a variation of Embodiment 2.
Figure 23:
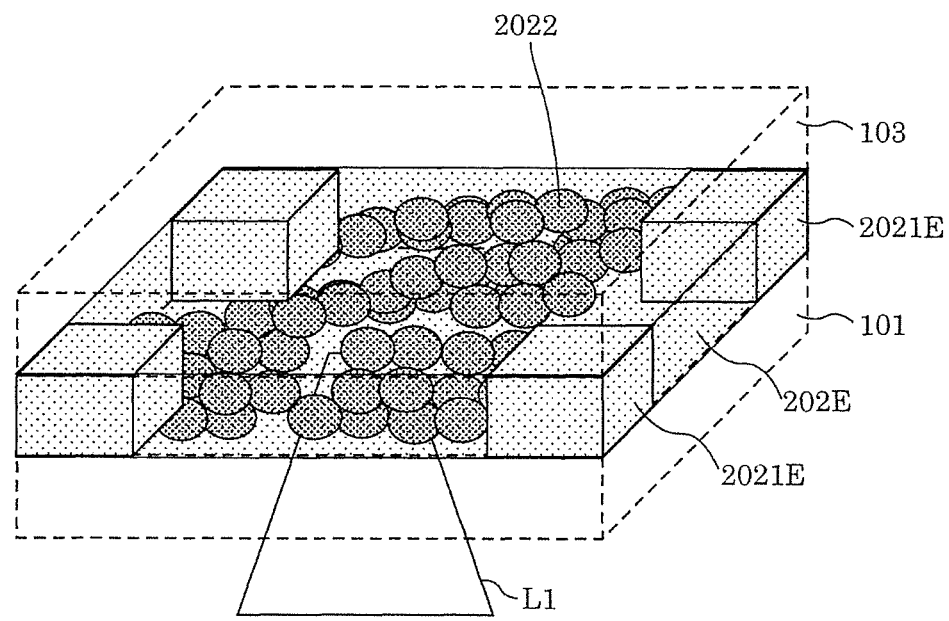
FIG. 23 is a schematic diagram illustrating another example of a gap-maintaining component in a variation of Embodiment 2.

In this variation, the gap-maintaining component is described as the plurality of thickness adjustment particles arranged as illustrated, for example, in FIG. 19, but this is not limiting. The gap-maintaining component may be any of those arranged as illustrated in FIG. 21 to FIG. 23; hereinafter, description thereof will be given with reference to the figures. Each of FIG. 21 to FIG. 23 is a schematic diagram illustrating another example of the gap-maintaining component in a variation of Embodiment 2. Note that the same numerical reference marks are assigned to components that are the same as or similar to those in FIG. 19, and detailed description thereof will be omitted.

As illustrate in FIG. 21, gap-maintaining component 2021C may be a wire-shaped thickness adjustment object that is light-transmissive and has a uniform thickness along the thickness of phosphor layer 202C. Also in this case, it is sufficient that gap-maintaining component 2021C be arranged in a position away from the spot position of the emitted laser light on phosphor layer 202C in top view. Note that gap-maintaining component 2021C may or may not be contained in phosphor layer 202C.

As illustrate in FIG. 22, gap-maintaining component 2021D may be a ring-shaped thickness adjustment object that is light-transmissive and has a uniform thickness along the thickness of phosphor layer 202D. Also in this case, it is sufficient that gap-maintaining component 2021D be arranged in a position at least a predetermined distance away from the spot position of the emitted laser light on phosphor layer 202D in top view. Note that gap-maintaining component 2021D may or may not be contained in phosphor layer 202D.

As illustrate in FIG. 23, gap-maintaining component 2021E may be a protruding thickness adjustment object that is light-transmissive and has a uniform thickness along the thickness of phosphor layer 202E. Also in this case, it is sufficient that gap-maintaining component 2021E be arranged in a position away from the spot position of the emitted laser light on phosphor layer 202E in top view. Note that gap-maintaining component 2021E may or may not be contained in phosphor layer 202E.

Embodiment 3

Embodiment 1, etc., have described: the wavelength conversion device for laser light which is capable of increasing the heat dissipation effect by sandwiching a phosphor layer, namely, phosphor layer 102, etc., between first substrate 101 and second substrate 103 each of which has a higher thermal conductivity than the thermal conductivity of the phosphor layer; and the lighting apparatus using the wavelength conversion device for laser light. This is because this configuration allows heat generated in the phosphor layer to be reliably dissipated to the outside through by first substrate 101 and second substrate 103.

This embodiment will describe: a wavelength conversion device for laser light which is capable of further increasing the heat dissipation effect by equipping the second substrate with a lens function; and a lighting apparatus using the wavelength conversion device for laser light.

[Lighting Apparatus]

Hereinafter, a lighting apparatus will be described first as an example of an application product using a wavelength conversion device in this embodiment.

Figure 24:
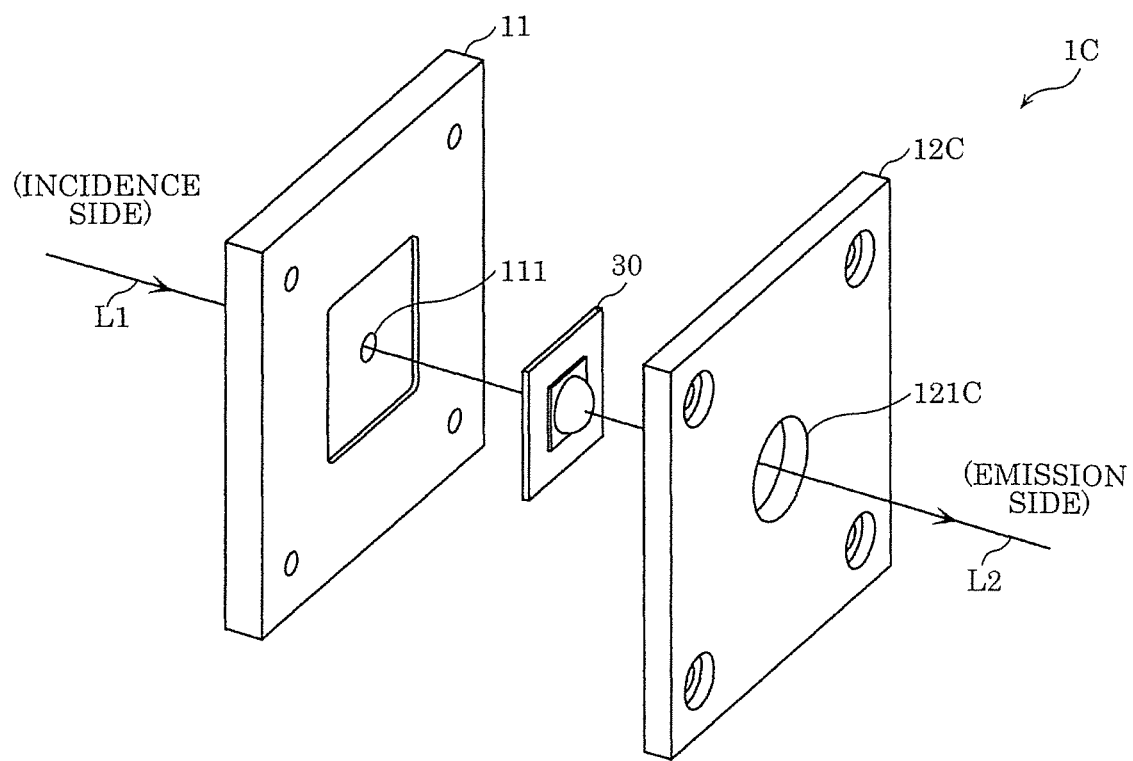
FIG. 24 is a diagram illustrating an example of a lighting apparatus in which a wavelength conversion device in Embodiment 3 is used.
Figure 25:
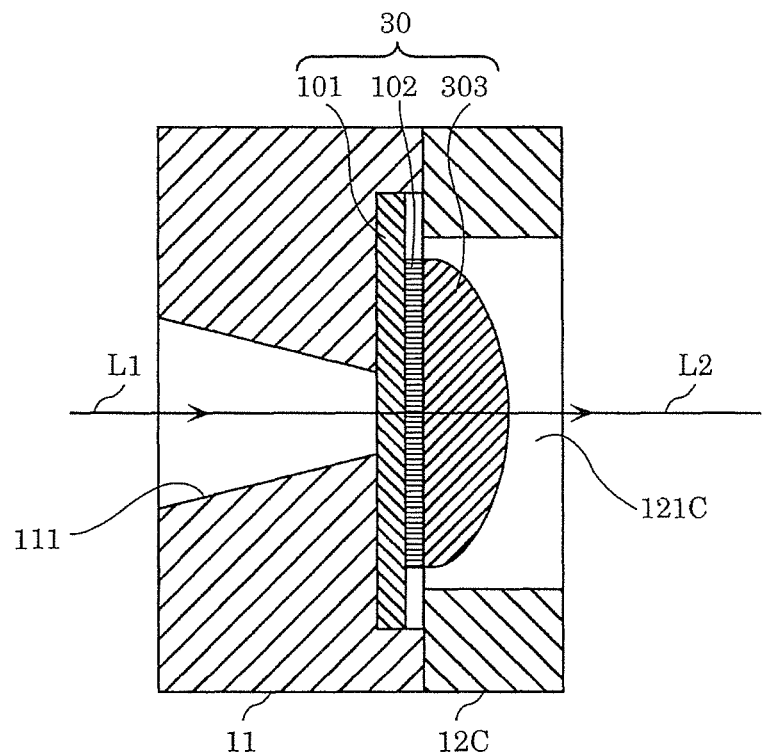
FIG. 25 is a cross-sectional view of the lighting apparatus illustrated in FIG. 24.

FIG. 24 is a diagram illustrating an example of lighting apparatus 1C in which wavelength conversion device 30 in this embodiment is used. FIG. 25 is a cross-sectional view of lighting apparatus 1C illustrated in FIG. 24. Note that the same numerical reference marks are assigned to components that are the same as or similar to those in FIG. 1 and FIG. 2, and detailed description thereof will be omitted.

Lighting apparatus 1C illustrated in FIG. 24 is different from lighting apparatus 1 illustrated in FIG. 1 in terms of the configurations of wavelength conversion device 30 and heat-dissipating plate 12C.

[Heat-Dissipating Plate 12C]

Heat-dissipating plate 12C is different from heat-dissipating plate 12 illustrated in FIG. 1 in terms of the size of opening 121C.

Opening 121C is for allowing passage of the white light emitted from wavelength conversion device 30 so that the white light is emitted to the outside of lighting apparatus 1C. Opening 121C is located on an optical path of the laser light emitted from the laser light source. Furthermore, opening 121C is larger in size than second substrate 303 of wavelength conversion device 30 and is provided in such a manner that second substrate 303 is exposed. Accordingly, the white light emitted from wavelength conversion device 30 is emitted to the outside of lighting apparatus 1C through opening 121C.

[Wavelength Conversion Device 30]

As illustrated in FIG. 25, wavelength conversion device 30, which is a wavelength conversion device for laser light, includes first substrate 101, phosphor layer 102, and second substrate 303. Wavelength conversion device 30 illustrated in FIG. 25 is different from wavelength conversion device 10 illustrated in FIG. 2 in terms of the configuration of second substrate 303. Note that when lighting apparatus 1C is used for an endoscope or the like, wavelength conversion device 30 corresponds to a light source means which uses laser light, as with wavelength conversion device 10 and the like.

(Second Substrate 303)

Second substrate 303 is different from second substrate 103 illustrated in FIG. 2 in that second substrate 303 is shaped like a hemispherical lens protruding away from first substrate 101. Stated differently, second substrate 303 is different from second substrate 103 illustrated in FIG. 2 in that second substrate 303 further includes a hemispherical lens function.

The other points are substantially the same as those of second substrate 103 illustrated in FIG. 2. For example, second substrate 303 is in surface contact with a portion on which phosphor layer 102 is provided and is irradiated with white light emitted from phosphor layer 102. Furthermore, second substrate 303 is, for example, a sapphire substrate which is light-transmissive and has a thermal conductivity higher than the thermal conductivity of phosphor layer 102.

[Advantageous Effects, Etc.]

The advantageous effects of wavelength conversion device 30 according to this embodiment will be described with reference to FIG. 26 and FIG. 27.

Figure 26:
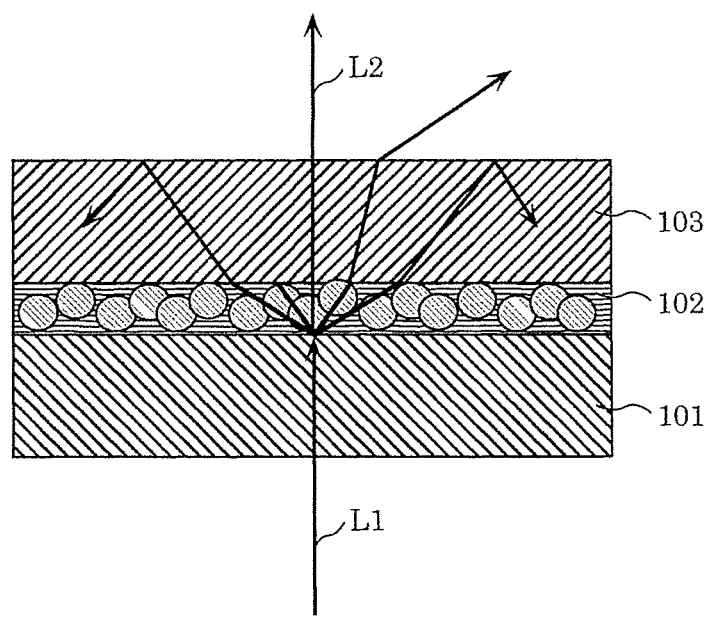
FIG. 26 is a diagram for describing white light emitted by a wavelength conversion device in a comparative example of Embodiment 3.

FIG. 26 is a diagram for describing white light emitted by wavelength conversion device 10 in a comparative example of Embodiment 3. FIG. 27 is a diagram for describing white light emitted by wavelength conversion device 30 in this embodiment. Note that FIG. 26 illustrates wavelength conversion device 10 in Embodiment 1 as a comparative example. The same numerical reference marks are assigned to components that are the same as or similar to those in FIG. 2, FIG. 25, etc., and detailed description thereof will be omitted.

Wavelength conversion device 10 illustrated in FIG. 26 includes second substrate 103 in a tabular shape as described in Embodiment 1. Each of first substrate 101 and second substrate 103 is a light-transmissive sapphire substrate, and wavelength conversion device 10 is irradiated with light (L1 in the figure) having a predetermined wavelength emitted from the laser light source. Phosphor layer 102 emits white light (L2 n the figure) resulting from color (wavelength) conversion of the light having a predetermined wavelength emitted from the laser light source.

Second substrate 103 configured as described above is formed of a sapphire substrate that is highly light-transmissive and has a high thermal conductivity, thus allowing passage of most of the white light emitted from phosphor layer 102, to emit the white light to opening 121 of heat-dissipating plate 12. Furthermore, since the thermal conductivity of second substrate 103 is higher than the thermal conductivity of phosphor layer 102, second substrate 103 can transmit heat generated by phosphor layer 102 upon converting the color of the light, and disperse the heat into the air.

However, since the refractive index of sapphire is as high as approximately 1.8, the critical angle at the interface between the air and second substrate 103 formed in a tabular shape becomes small. In other words, as illustrated in FIG. 26, when the angle (incidence angle) of white light entering second substrate 103 from phosphor layer 102 is greater than a predetermined value, total reflection occurs, and the white light is enclosed in second substrate 103, causing a loss of light.

Figure 27:
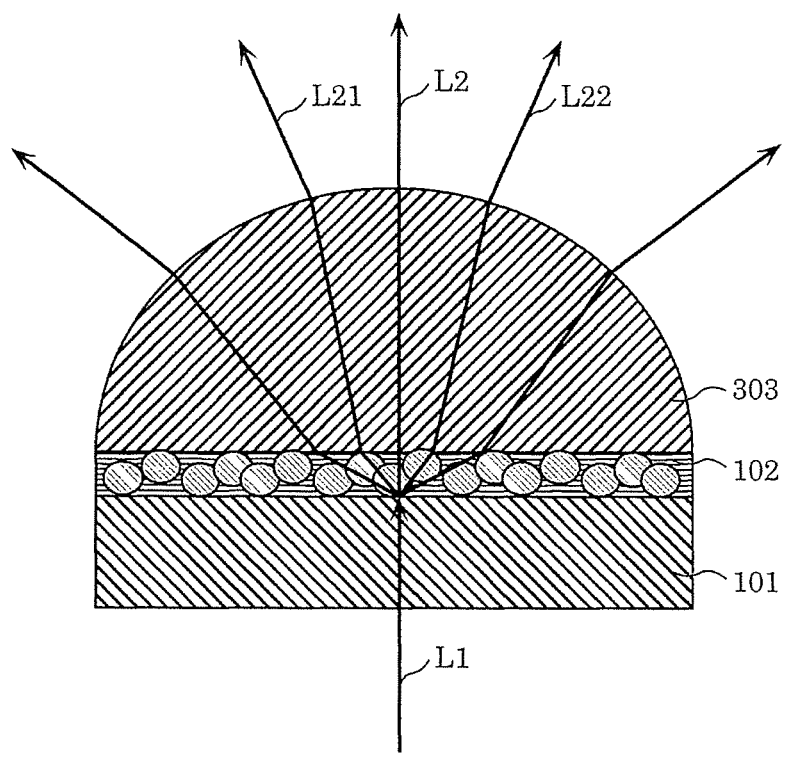
FIG. 27 is a diagram for describing white light emitted by a wavelength conversion device in Embodiment 3.

In contrast, wavelength conversion device 30 illustrated in FIG. 27 includes second substrate 303 shaped like a hemispherical lens protruding away from first substrate 101. Each of first substrate 101 and second substrate 303 is a light-transmissive sapphire substrate, and wavelength conversion device 30 is irradiated with light (L1 in the figure) having a predetermined wavelength emitted from the laser light source. Phosphor layer 102 emits white light (L2, L21, and L22 n the figure) resulting from color (wavelength) conversion of the light having a predetermined wavelength emitted from the laser light source.

Second substrate 303 configured as described above includes a hemispherical lens function in addition to the feature of being formed of a sapphire substrate that is highly light-transmissive and has a high thermal conductivity. With this, even though the refractive index of sapphire is as high as approximately 1.8, by shaping second substrate 303 like a hemispherical lens, the critical angle at the interface between second substrate 303 and the air can be made large, and thus it is possible to reduce light that is enclosed in second substrate 303. Specifically, as illustrated in FIG. 27, even when the angle (incidence angle) of the white light entering second substrate 303 from phosphor layer 102 is greater than a predetermined value, there is no longer white light that causes total reflection (the white light is not enclosed in second substrate 303), and thus the loss of light can be reduced. Therefore, wavelength conversion device 30 can further increase the light extraction efficiency, compared to wavelength conversion device 10.

Furthermore, as a result of second substrate 303 being shaped like a hemispherical lens, the interface between second substrate 303 and the air is large, and thus the heat transmitted from phosphor layer 102 can further be dispersed into the air. Therefore, wavelength conversion device 30 can further increase the heat dissipation effect, compared to wavelength conversion device 10.

As described above, in this embodiment, second substrate 303 is shaped like a hemispherical lens protruding away from first substrate 101. With this, wavelength conversion device 30 including second substrate 303 can further increase the light extraction efficiency and the heat dissipation effect.

Note that in this embodiment, wavelength conversion device 30 is described as including phosphor layer 102, but this is not limiting. Wavelength conversion device 30 may include phosphor layer 202 or the like.

Furthermore, although this embodiment has described an example in the case where wavelength conversion device 30 includes second substrate 303 shaped like a hemispherical lens to equip second substrate 303 with a lens function, this is not limiting. It is also possible to equip second substrate 303 with a lens function by forming second substrate 303 into a shape different from the shape of the hemispherical lens, for example, the shape of an aspheric lens or the shape of a microlens. These cases will be described below as variations.

(Variation 1)

Figure 28:
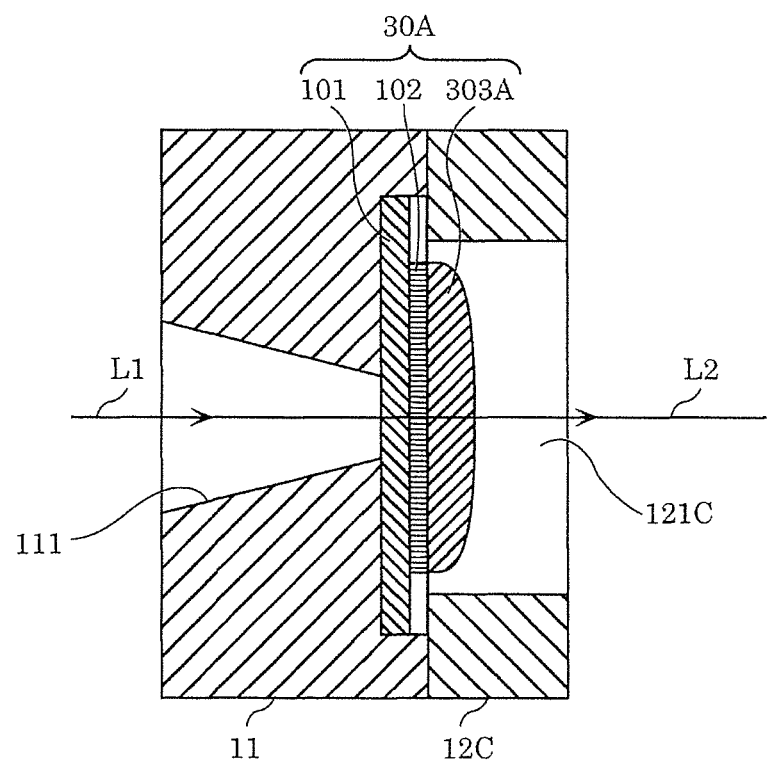
FIG. 28 is another cross-sectional view of the lighting apparatus illustrated in FIG. 24.

FIG. 28 is another cross-sectional view of lighting apparatus 1C illustrated in FIG. 24. Note that the same numerical reference marks are assigned to components that are the same as or similar to those in FIG. 1, FIG. 2, and FIG. 25, and detailed description thereof will be omitted.

[Wavelength Conversion Device 30A]

As illustrated in FIG. 28, wavelength conversion device 30A, which is a wavelength conversion device for laser light, includes first substrate 101, phosphor layer 102, and second substrate 303A.

Wavelength conversion device 30A illustrated in FIG. 28 is different from wavelength conversion device 30 illustrated in FIG. 25 in terms of the configuration of second substrate 303A.

(Second Substrate 303A)

Second substrate 303A is different from second substrate 303 illustrated in FIG. 25 in that second substrate 303A is shaped like a non-hemispherical lens protruding away from first substrate 101. Stated differently, second substrate 303A is different from second substrate 103 illustrated in FIG. 2 in that second substrate 303A further includes a non-hemispherical lens function.

The other points are substantially the same as those of second substrate 103 illustrated in FIG. 2 and second substrate 303 illustrated in FIG. 25, and description thereof will not be repeated here.

[Advantageous Effects, Etc.]

Figure 29:
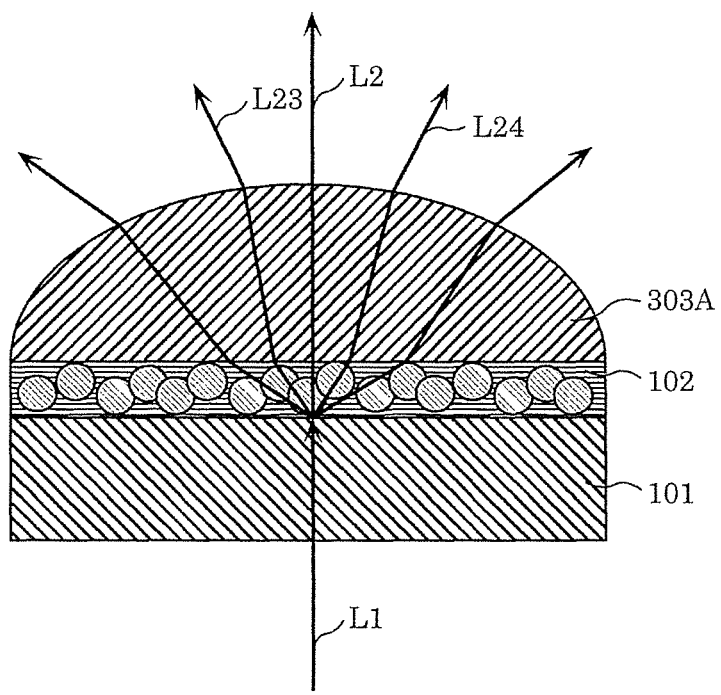
FIG. 29 is a diagram for describing white light emitted by a wavelength conversion device in Variation 1 of Embodiment 3.

The advantageous effects of wavelength conversion device 30A according to this variation will be described with reference to FIG. 27 and FIG. 29. FIG. 29 is a diagram for describing white light emitted by wavelength conversion device 30A in Variation 1 of Embodiment 3. Note that the same numerical reference marks are assigned to components that are the same as or similar to those in FIG. 2, FIG. 25, and FIG. 27, and detailed description thereof will be omitted.

Wavelength conversion device 30A illustrated in FIG. 29 includes second substrate 303A shaped like a non-hemispherical lens protruding away from first substrate 101. Each of first substrate 101 and second substrate 303A is a light-transmissive sapphire substrate, and wavelength conversion device 30A is irradiated with light (L1 in the figure) having a predetermined wavelength emitted from the laser light source. Phosphor layer 102 emits white light (L2, L23, and L24 in the figure) resulting from color (wavelength) conversion of the light having a predetermined wavelength emitted from the laser light source.

Second substrate 303A configured as described above includes a non-hemispherical half-lens function in addition to the feature of being formed of a sapphire substrate that is highly light-transmissive and has a high thermal conductivity. With this, even though the refractive index of sapphire is as high as approximately 1.8, by shaping second substrate 303A like a non-hemispherical half lens, the critical angle at the interface between second substrate 303A and the air can be made large, and thus it is possible to reduce light that is enclosed in second substrate 303A. Specifically, as illustrated in FIG. 29, even when the angle (incidence angle) of the white light entering second substrate 303A from phosphor layer 102 is greater than a predetermined value, there is no longer white light that causes total reflection (the white light is not enclosed in second substrate 303A), and thus the loss of light can be reduced. Therefore, wavelength conversion device 30A can further increase the light extraction efficiency, compared to wavelength conversion device 10.

Furthermore, as a result of second substrate 303A being shaped like a non-hemispherical half lens, the interface between second substrate 303A and the air is large, and thus the heat transmitted from phosphor layer 102 can further be dispersed into the air. Therefore, wavelength conversion device 30A can further increase the heat dissipation effect, compared to wavelength conversion device 10.

Furthermore, as a result of second substrate 303A being shaped like a non-hemispherical half lens, the vertex (the lens height along the minor axis) thereof can be made lower in level than that in the case of being shaped like a hemispherical lens. Thus, wavelength conversion device 30A can be more compact than wavelength conversion device 30, and a luminaire or a light source device that incorporates wavelength conversion device 30A can be made compact.

As described above, in this variation, second substrate 303A is shaped like a non-hemispherical lens protruding away from first substrate 101. With this, wavelength conversion device 30A including second substrate 303A can further increase the light extraction efficiency and the heat dissipation effect.

Note that in this variation, wavelength conversion device 30A is described as including phosphor layer 102, but this is not limiting. Wavelength conversion device 30A may include phosphor layer 202 or the like, and the same applies to such a case.

(Variation 2)

Figure 30:
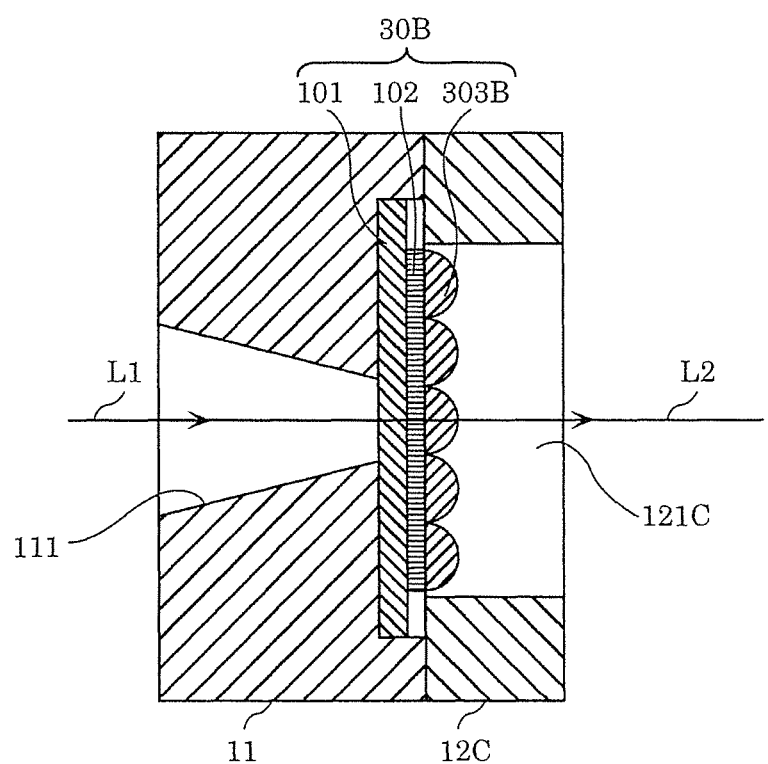
FIG. 30 is another cross-sectional view of the lighting apparatus illustrated in FIG. 24.

FIG. 30 is another cross-sectional view of lighting apparatus 1C illustrated in FIG. 24. Note that the same numerical reference marks are assigned to components that are the same as or similar to those in FIG. 1, FIG. 2, and FIG. 25, and detailed description thereof will be omitted.

[Wavelength Conversion Device 30B]

As illustrated in FIG. 30, wavelength conversion device 30B, which is a wavelength conversion device for laser light, includes first substrate 101, phosphor layer 102, and second substrate 303B.

Wavelength conversion device 30B illustrated in FIG. 30 is different from wavelength conversion device 30 illustrated in FIG. 25 in terms of the configuration of second substrate 303B.

(Second Substrate 303B)

Second substrate 303B is different from second substrate 303 illustrated in FIG. 25 in that second substrate 303B is shaped like a lens array protruding away from first substrate 101. Stated differently, second substrate 303B is different from second substrate 103 illustrated in FIG. 2 in that second substrate 303B further includes a microlens array function.

The other points are substantially the same as those of second substrate 103 illustrated in FIG. 2 and second substrate 303 illustrated in FIG. 25, and description thereof will not be repeated here.

[Advantageous Effects, Etc.]

Figure 31:
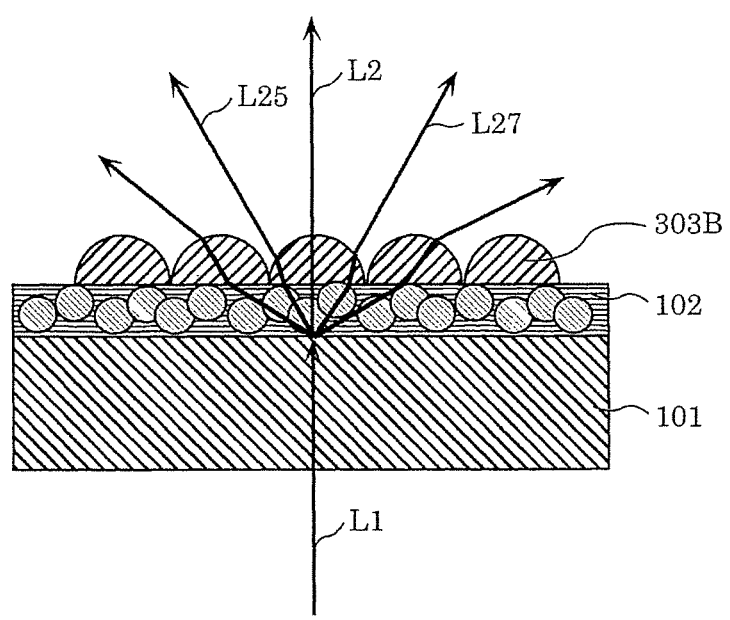
FIG. 31 is a diagram for describing white light emitted by a wavelength conversion device in Variation 2 of Embodiment 3.

The advantageous effects of wavelength conversion device 30B according to this variation will be described with reference to FIG. 27 and FIG. 31. FIG. 31 is a diagram for describing white light emitted by wavelength conversion device 30B in Variation 2 of Embodiment 3. Note that the same numerical reference marks are assigned to components that are the same as or similar to those in FIG. 2, FIG. 25, and FIG. 27, and detailed description thereof will be omitted.

Wavelength conversion device 30B illustrated in FIG. 31 includes second substrate 303B shaped like a lens array protruding away from first substrate 101. Each of first substrate 101 and second substrate 303B is a light-transmissive sapphire substrate, and wavelength conversion device 30B is irradiated with light (L1 in the figure) having a predetermined wavelength emitted from the laser light source. Phosphor layer 102 emits white light (L2, L25, and L27 n the figure) resulting from color (wavelength) conversion of the light having a predetermined wavelength emitted from the laser light source.

Second substrate 303B configured as described above includes a microlens array function in addition to the feature of being formed of a sapphire substrate that is highly light-transmissive and has a high thermal conductivity. With this, even though the refractive index of sapphire is as high as approximately 1.8, by shaping second substrate 303B like a microlens array, the critical angle at the interface between second substrate 303B and the air can be made large, and thus it is possible to reduce light that is enclosed in second substrate 303B. Specifically, as illustrated in FIG. 31, even when the angle (incidence angle) of the white light entering second substrate 303B from phosphor layer 102 is greater than a predetermined value, there is no longer white light that causes total reflection (the white light is not enclosed in second substrate 303B), and thus the loss of light can be reduced. Therefore, wavelength conversion device 30B can further increase the light extraction efficiency, compared to wavelength conversion device 10.

Furthermore, as a result of second substrate 303B being shaped like a microlens array, the interface between second substrate 303B and the air is large, and thus the heat transmitted from phosphor layer 102 can further be dispersed into the air. Therefore, wavelength conversion device 30B can further increase the heat dissipation effect, compared to wavelength conversion device 10.

Furthermore, as a result of second substrate 303B being shaped like a microlens array, the vertex (the lens height along the minor axis) thereof can be made lower in level than that in the case of being shaped like a hemispherical lens. Thus, wavelength conversion device 30B can be more compact than wavelength conversion device 30, and a luminaire or a light source device that incorporates wavelength conversion device 30B can be made compact.

In addition, it is possible to control light distribution by adjusting the pitch, diameter, or cross-sectional shape of the microlens array.

As described above, in this variation, second substrate 303B is shaped like a lens array protruding away from first substrate 101. With this, wavelength conversion device 30B including second substrate 303B can further increase the light extraction efficiency and the heat dissipation effect.

Note that in this variation, wavelength conversion device 30B is described as including phosphor layer 102, but this is not limiting. Wavelength conversion device 30B may include phosphor layer 202 or the like, and the same applies to such a case.

Other Embodiments, Etc.

Although the wavelength conversion device for laser light and the lighting apparatus according to the present invention have been described based on embodiments, the present invention is not limited to the above-described embodiments.

Each of the above-described embodiments is merely one example, and various modifications, additions, and omissions are possible.

Furthermore, forms realized by arbitrarily combining structural components and functions shown in the above-described embodiments are included in the scope of the present invention. Forms obtained by various modifications to each of the foregoing embodiments that can be conceived by a person of skill in the art as well as forms realized by arbitrarily combining structural components and functions in each of the embodiments which are within the scope of the essence of the present invention are included in the present invention.

For example, a lighting apparatus using wavelength conversion device 10, etc., for laser light in the foregoing embodiment is included in the present invention. Using wavelength conversion device 10, etc., for laser light in the foregoing embodiment in a lighting apparatus enables further decrease in size than with a lighting apparatus using an LED light source.

Reference Marks in the Drawings

The invention claimed is:

1. A wavelength conversion device for laser light, comprising:
   a laser light source that emits laser light having a predetermined wavelength;
   a first substrate that is light-transmissive;
   a second substrate that is light-transmissive;
   a phosphor layer provided between and in surface contact with the first substrate and the second substrate, the phosphor layer converting a wavelength of the laser light from the laser light source which is incident on the phosphor layer; and a gap-maintaining component located between the first substrate and the second substrate, the gap-maintaining component adjusting a thickness of the phosphor layer by maintaining a uniform distance between the first substrate and the second substrate, wherein each of the first substrate and the second substrate has a thermal conductivity higher than a thermal conductivity of the phosphor layer, the gap-maintaining component is a plurality of thickness adjustment particles that are light-transmissive and have substantially equal diameters, and the plurality of thickness adjustment particles are contained in the phosphor layer.

2. The wavelength conversion device according to claim 1, wherein each of the plurality of thickness adjustment particles has a refractive index equal to a refractive index of a sealing resin that seals a phosphor in the phosphor layer.

3. The wavelength conversion device according to claim 1, wherein the laser light source emits blue laser light as the laser light having the predetermined wavelength, and the phosphor layer converts a wavelength of part of the blue laser light to light in a wavelength range representing yellow light.

4. A lighting apparatus, comprising:
the wavelength conversion device according to claim 1.

5. The wavelength conversion device according to claim 1, wherein each of the plurality of thickness adjustment particles has a refractive index different from a refractive index of a sealing resin that seals a phosphor in the phosphor layer, and the plurality of thickness adjustment particles are arranged in positions away from a spot position of the laser light on the phosphor layer in top view, the laser light being emitted to the phosphor layer.

6. The wavelength conversion device according to claim 5, wherein the plurality of thickness adjustment particles are arranged in positions away from the spot position, in a ring pattern centered on the spot position, in top view.

7. The wavelength conversion device according to claim 5, wherein the plurality of thickness adjustment particles are arranged in the positions away from the spot position as a result of being arranged on the phosphor layer other than a region a predetermined distance away from the spot position in top view.

8. The wavelength conversion device according to claim 1, wherein the plurality of thickness adjustment particles are any of silica beads consisting of silica, silicone beads consisting of silicone, and glass beads consisting of glass.

9. The wavelength conversion device according to claim 1, wherein each of the first substrate and the second substrate is a sapphire substrate.

10. The wavelength conversion device according to claim 9, wherein the second substrate is further shaped like a hemispherical lens protruding away from the first substrate.

11. The wavelength conversion device according to claim 9, wherein the second substrate is further shaped like an aspheric lens protruding away from the first substrate.

12. The wavelength conversion device according to claim 9, wherein the second substrate is further shaped like a lens array protruding away from the first substrate.

* * * * *